(12) United States Patent
Toyomura

(10) Patent No.: US 12,417,747 B2
(45) Date of Patent: Sep. 16, 2025

(54) DISPLAY DEVICE, DRIVE METHOD FOR DISPLAY DEVICE, AND ELECTRONIC APPARATUS

(71) Applicant: Sony Semiconductor Solutions Corporation, Kanagawa (JP)

(72) Inventor: Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/389,682

(22) Filed: Dec. 19, 2023

(65) Prior Publication Data

US 2024/0135887 A1 Apr. 25, 2024

Related U.S. Application Data

(63) Continuation of application No. 17/777,565, filed as application No. PCT/JP2020/042372 on Nov. 13, 2020, now Pat. No. 11,900,887.

(30) Foreign Application Priority Data

Dec. 17, 2019 (JP) ................. 2019-227292

(51) Int. Cl.
*G09G 3/3275* (2016.01)
*G09G 3/3266* (2016.01)
(Continued)

(52) U.S. Cl.
CPC ......... *G09G 3/3275* (2013.01); *G09G 3/3266* (2013.01); *G09G 3/3677* (2013.01);
(Continued)

(58) Field of Classification Search
CPC .. G09G 3/3275; G09G 3/3266; G09G 3/3677; G09G 3/3688; G09G 2300/0439;
(Continued)

(56) References Cited

U.S. PATENT DOCUMENTS

2004/0135778 A1* 7/2004 Sato ..................... G09G 3/3688
345/204
2005/0156828 A1 7/2005 Yamashita et al.
(Continued)

FOREIGN PATENT DOCUMENTS

JP 2002533788 A 10/2002
JP 2004526998 A 9/2004
(Continued)

*Primary Examiner* — David Tung
(74) *Attorney, Agent, or Firm* — Michael Best & Friedrich LLP

(57) ABSTRACT

A display device includes at least display elements arranged in a two-dimensional matrix, data lines provided for respective display element columns, and a source driver that supplies a video signal voltage to the data lines, in which a display element row includes a display element belonging to a first group and a display element belonging to a second group different from the first group, the source driver includes a ramp signal generating circuit and a switch circuit that causes a data line to hold a video signal voltage, and when output of the ramp signal generating circuit and a data line are switched from a connected state to a disconnected state in order to cause the data line corresponding to a certain display element to hold a video signal voltage, a data line corresponding to a display element belonging to a group different from the group, to which the certain display element belongs, and output of the ramp signal generating circuit are switched from the disconnected state to the connected state.

18 Claims, 15 Drawing Sheets

(51) Int. Cl.
*G09G 3/36* (2006.01)
*H10K 59/00* (2023.01)

(52) U.S. Cl.
CPC ........... *G09G 3/3688* (2013.01); *H10K 59/00* (2023.02); *G09G 2310/0259* (2013.01); *G09G 2320/0209* (2013.01)

(58) Field of Classification Search
CPC ... G09G 2310/0259; G09G 2320/0209; H10K 50/00; H10K 59/00; H10K 59/121
See application file for complete search history.

(56) References Cited

U.S. PATENT DOCUMENTS

| | | |
|---|---|---|
| 2013/0099692 A1 | 4/2013 | Chaji et al. |
| 2013/0100173 A1 | 4/2013 | Chaji et al. |
| 2018/0337687 A1 | 11/2018 | Adjiwibawa et al. |

FOREIGN PATENT DOCUMENTS

| | | |
|---|---|---|
| JP | 2004527783 A | 9/2004 |
| JP | 2011053644 A | 3/2011 |
| KR | 100767370 B1 | 10/2007 |

\* cited by examiner

DISPLAY DEVICE, DRIVE METHOD FOR DISPLAY DEVICE, AND ELECTRONIC APPARATUS

CROSS REFERENCE TO RELATED APPLICATIONS

This application is a continuation Application of application Ser. No. 17/777,565, filed May 17, 2022, which is a U.S. Nationalization stage entry of International Application No. PCT/JP2020/042372, filed Nov. 13, 2020, which claims the benefit of Japanese Priority Patent Application No. JP2019-227292 filed with the Japan Patent Office on Dec. 17, 2019, the entire contents of which are incorporated herein by reference.

FIELD

The present disclosure relates to a display device, a drive method for the display device, and an electronic apparatus.

BACKGROUND

As a display device having display elements arranged in a two-dimensional matrix, liquid crystal display devices, organic electroluminescence display devices, and the like are well known. Usually, these display devices include a plurality of scanning lines extending in a first direction (for example, the row direction) and a plurality of data lines extending in a second direction (for example, the column direction) different from the first direction. And, with video signal voltages supplied, via the data lines, to display elements selected by scanning signals supplied to the scanning lines, an image is displayed.

A video signal voltage supplied via a data line is an analog signal voltage. However, in recent years, a digital video signal is input to a display device in many cases. In this case, a source driver that drives the data lines needs to perform digital-to-analog conversion for generating an analog signal voltage on the basis of a video signal provided as a digital signal. There are various schemes for digital-to-analog conversion, and it has been proposed to perform digital-to-analog conversion using a ramp signal in which a voltage varies with time over a predetermined period (see, for example, Patent Literature 1).

CITATION LIST

Patent Literature

Patent Literature 1: JP 2011-53644 A

SUMMARY

Technical Problem

The digital-to-analog conversion using a ramp signal performs an operation of sampling and holding the voltage of the ramp signal in a data line depending on the value of a video signal provided as a digital signal. In this case, a state in which the ramp signal is supplied to the data line is maintained until a gradation value given by the digital signal is reached. Therefore, since the load state on the ramp signal changes depending on a display image, there is a disadvantage that crosstalk or the like occurs in a displayed image.

An object of the present disclosure is to provide a display device capable of reducing a change in a load state on a ramp signal, a drive method for the display device, and an electronic apparatus including the display device.

Solution to Problem

To solve the problems described above, a display device according to the present disclosure includes at least: display elements arranged in a two-dimensional matrix in a first direction and a second direction different from the first direction; data lines provided for respective display element columns arranged along the second direction; and a source driver that supplies a video signal voltage to the data lines, wherein a display element row arranged along the first direction includes a display element belonging to a first group and a display element belonging to a second group different from the first group, the source driver comprises a ramp signal generating circuit and a switch circuit that causes a data line to hold a voltage as of a time point when the data line and output of the ramp signal generating circuit are switched from a connected state to a disconnected state, the ramp signal generating circuit generates, within one horizontal scanning period, at least a ramp signal used for setting a video signal voltage to a display element belonging to the first group and a ramp signal used for setting a video signal voltage to a display element belonging to the second group, and when output of the ramp signal generating circuit and a data line are switched from the connected state to the disconnected state in order to cause the data line corresponding to a certain display element to hold a video signal voltage, output of the ramp signal generating circuit and a data line corresponding to a display element belonging to a group different from the group, to which the certain display element belongs, are switched from the disconnected state to the connected state.

To solve the problems described above, a drive method for a display device according to the present disclosure includes the steps of: by using the display device including at least: display elements arranged in a two-dimensional matrix in a first direction and a second direction different from the first direction; data lines provided for respective display element columns arranged along the second direction; and a source driver that supplies a video signal voltage to the data lines, wherein a display element row arranged along the first direction includes a display element belonging to a first group and a display element belonging to a second group different from the first group, and the source driver comprises a ramp signal generating circuit and a switch circuit that causes a data line to hold a voltage as of a time point when the data line and output of the ramp signal generating circuit are switched from a connected state to a disconnected state, by the ramp signal generating circuit, generating, within one horizontal scanning period, at least a ramp signal used for setting a video signal voltage to a display element belonging to the first group and a ramp signal used for setting a video signal voltage to a display element belonging to the second group, and when switching output of the ramp signal generating circuit and a data line from the connected state to the disconnected state in order to cause the data line corresponding to a certain display element to hold a video signal voltage, switching output of the ramp signal generating circuit and a data line corresponding to a display element belonging to a group different from the group, to which the certain display element belongs, from the disconnected state to the connected state.

To solve the problems described above, an electronic apparatus according to the present disclosure includes a display device, the display device including at least: display elements arranged in a two-dimensional matrix in a first direction and a second direction different from the first direction; data lines provided for respective display element columns arranged along the second direction; and a source driver that supplies a video signal voltage to the data lines, wherein a display element row arranged along the first direction includes a display element belonging to a first group and a display element belonging to a second group different from the first group, the source driver comprises a ramp signal generating circuit and a switch circuit that causes a data line to hold a voltage as of a time point when the data line and output of the ramp signal generating circuit are switched from a connected state to a disconnected state, the ramp signal generating circuit generates, within one horizontal scanning period, at least a ramp signal used for setting a video signal voltage to a display element belonging to the first group and a ramp signal used for setting a video signal voltage to a display element belonging to the second group, and when output of the ramp signal generating circuit and a data line are switched from the connected state to the disconnected state in order to cause the data line corresponding to a certain display element to hold a video signal voltage, output of the ramp signal generating circuit and a data line corresponding to a display element belonging to a group different from the group, to which the certain display element belongs, are switched from the disconnected state to the connected state.

DESCRIPTION OF EMBODIMENTS

Figure 1:
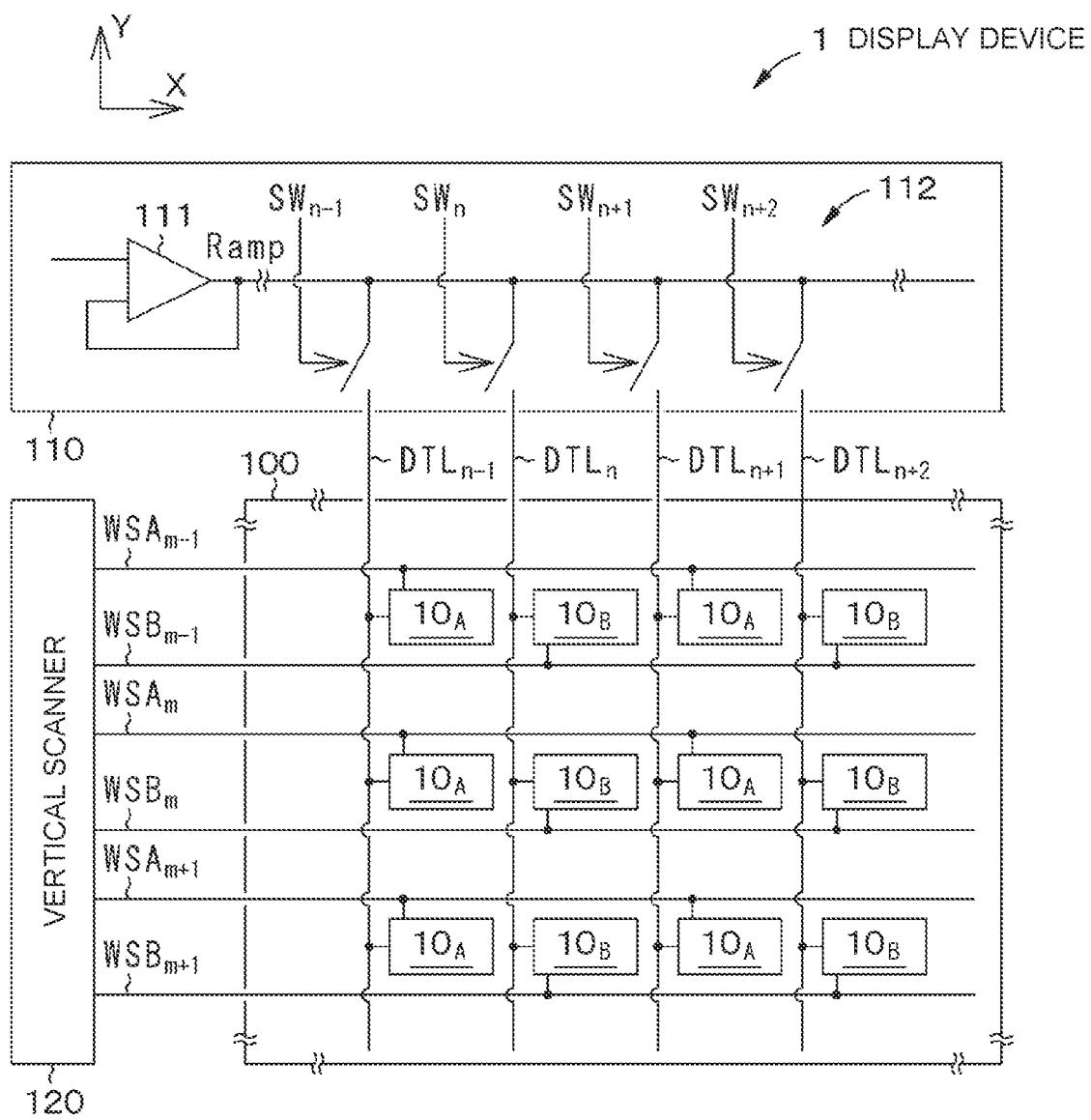
FIG. 1 is a conceptual diagram of a display device according to a first embodiment.

Hereinafter, the present disclosure will be described on the basis of embodiments with reference to the drawings. The present disclosure is not limited to the embodiments, and various numerical values and materials in the embodiments are examples. In the following description, the same symbols will be used for the same elements or elements having the same function, and redundant description will be omitted. Note that the description will be given in the following order.

1. Description in general on a display device, a drive method for the display device, and an electronic apparatus according to the present disclosure.
2. First Embodiment
3. First Modification
4. Description of Electronic Apparatus, and Others Description in General on Display Device, Drive Method for Display Device, and Electronic Apparatus According to Present Invention In the following description, a display device according to the present disclosure, a display device used in a drive method for a display device according to the present disclosure, and a display device included in an electronic apparatus according to the present disclosure may be simply referred to as a [display device of the present disclosure].

As described above, a display device of the present disclosure includes at least:

display elements arranged in a two-dimensional matrix in a first direction and a second direction different from the first direction;

data lines provided for respective display element columns arranged along the second direction; and a source driver that supplies a video signal voltage to the data lines, in which a display element row arranged along the first direction includes a display element belonging to a first group and a display element belonging to a second group different from the first group, and the source driver includes a ramp signal generating circuit and a switch circuit that causes a data line to hold a voltage as of a time point when the data line and output of the ramp signal generating circuit are switched from a connected state to a disconnected state.

In addition, the ramp signal generating circuit generates, in one horizontal scanning period, at least a ramp signal used for setting a video signal voltage to the display element belonging to the first group and a ramp signal used for setting a video signal voltage to the display element belonging to the second group, and when output of the ramp signal generating circuit and a data line are switched from the connected state to the disconnected state in order to cause the data line corresponding to a certain display element to hold a video signal voltage, a data line corresponding to a display element belonging to a group different from the group, to which the certain display element belongs, and output of the ramp signal generating circuit are switched from the disconnected state to the connected state.

The arrangement of the display element belonging to the first group and the display element belonging to the second group in the display element row is not particularly limited as long as implementation of the present disclosure is not hindered. For example, the first group may be disposed on the left side and the second group may be disposed on the right side with respect to the center of the display element row. From the viewpoint of uniformizing the arrangement state, it is preferable that display elements belonging to the first group and display elements belonging to the second group are alternately arranged in a display element row. In this case, it can be configured so that, in the display element row, when output of the ramp signal generating circuit and a data line are switched from the connected state to the disconnected state in order to cause the data line corresponding to one display element of a pair of adjacent display elements to hold a video signal voltage, a data line corresponding to the other display element of the pair of the adjacent display elements and output of the ramp signal generating circuit are switched from the disconnected state to the connected state.

The display devices of the present disclosure including the above-described various preferable configurations can further include:

a first scanning line connected to a display element belonging to the first group and a second scanning line connected to a display element belonging to the second group, the first scanning line and the second scanning line being provided for every display element row arranged along the first direction; and a vertical scanner that supplies a scanning signal to the first scanning line and the second scanning line.

In the display devices of the present disclosure including the above-described various preferable configurations, the configuration of a display element is not particularly limited. From the viewpoint of configuring a planar display device, it is preferable that a display element includes an organic electroluminescence display element or a liquid crystal display element. An organic electroluminescence display element is a display element including an organic electroluminescence element as a light emitting unit of a current drive type and can include a light emitting unit and a drive circuit that drives the light emitting unit. A video signal voltage from a data line is supplied to a display element via a writing transistor or the like included in the drive circuit. Meanwhile, a liquid crystal display element includes a common electrode, a pixel electrode, a capacitor, a liquid crystal material layer sandwiched between the common electrode and the pixel electrode, a writing transistor, and the like, and a video signal voltage from a data line is supplied to the pixel electrode via the writing transistor and the like.

The display devices of the present disclosure including the above-described various preferable configurations can further include a second source driver, in which the source driver and the second source driver are arranged on one end side and the other end side of each of the data lines, respectively, and the second source driver supplies a signal corresponding to a ramp signal to the data lines before a data line corresponding to a display element belonging to a group different from a group to which a certain display element belongs and output of the ramp signal generating circuit are switched from the disconnected state to the connected state.

According to this configuration, since a voltage value as of the time when the data line corresponding to the display element belonging to the group different from the group to which the certain display element belongs and the output of the ramp signal generating circuit are switched from the disconnected state to the connected state can be matched with a voltage value supplied by the source driver, it is possible to suppress fluctuations in the voltage of the source driver at the time of the switching.

Hereinafter, a display device according to the present disclosure, a drive method for the display device according to the present disclosure, and an electronic apparatus according to the present disclosure may be simply referred to as [the present disclosure].

In the present disclosure, a display element included in a pixel can be formed in a certain plane, for example, on a substrate.

The conductivity type of a transistor used for a display element is not particularly limited. For example, the above-described writing transistor, a drive transistor that drives the light emitting unit including an organic electroluminescence element, or the like may be a p-channel transistor or an n-channel transistor.

In a case where the drive transistor is a p-channel type, the light emitting unit emits light when a low-level voltage is applied to the gate of the drive transistor. Meanwhile, when a sufficient high level voltage is applied to the gate, the light emitting unit is turned off. In the following description, a state in which the display device operates on the basis of a video signal corresponding to display with the highest luminance in the specification may be referred to as "white display", and a state in which the display device operates on the basis of a video signal corresponding to display with the lowest luminance in the specification may be referred to as "black display".

The source driver or the like that drives the display device may be integrated in lamination on a substrate or the like on which the display elements are disposed or may be configured as a separate body as appropriate. These can be configured using well-known circuit elements. For example, the vertical scanner illustrated in FIG. 1, a power supply circuit (not illustrated), or the like can also be configured using well-known circuit elements. In applications where miniaturization is required, such as display devices for head mounted displays or viewfinders, it is preferable that display elements and a driver are formed on the same semiconductor substrate or the like.

The display device may have a so-called monochrome display configuration or a color display configuration. In the case of a color display configuration, one pixel may include a plurality of sub-pixels, specifically, one pixel may include three sub-pixels of a red light emitting sub-pixel, a green light emitting sub-pixel, and a blue light emitting sub-pixel. Furthermore, these three types of sub pixels may be further added with one type or a plurality of types of sub-pixels to form a set (for example, a set further including a sub-pixel that emits white light to improve luminance, a set further including a sub-pixel that emits complementary color to expand a color reproduction range, a set including a sub-pixel that emits yellow to expand a color reproduction range, or a set including sub-pixels that emit yellow and cyan to expand a color reproduction range).

The number of pixels of the display device can be exemplified by some resolutions for image display such as (1920,1035), (720,480), and (1280,960) in addition to VGA (640,480), S-VGA(800,600), XGA(1024,768), APRC(1152, 900), S-XGA(1280,1024), U-XGA(1600,1200), HD-TV (1920,1080), and Q-XGA(2048,1536); however, it is not limited to these values.

In addition, various electronic apparatuses having an image display function can be examples of an electronic apparatus including a display device of the present disclosure in addition to a direct-viewing type or projection type display device.

Various conditions in the present specification are satisfied not only when mathematically strictly established but also when substantially established. The presence of various variations caused by design or manufacturing is allowed. In addition, the drawings used in the following description are schematic and do not indicate actual dimensions or ratios thereof. For example, FIG. 7 to be described later illustrates a timing chart of a display device and does not illustrate ratios of the width, the height, or the like.

First Embodiment

A first embodiment relates to a display device, a drive method for the display device, and an electronic apparatus according to the present disclosure.

FIG. 1 is a conceptual diagram of a display device according to the first embodiment.

An outline of the display device will be described. A display device 1 includes at least:
 display elements 10 arranged in a two-dimensional matrix in a first direction (X direction in the drawing, that is, row direction) and a second direction (Y direction in the drawing, that is, column direction) different from the first direction;
 data lines DTL provided for respective display element columns arranged along the second direction; and
 a source driver 110 that supplies a video signal voltage to the data lines DTL. A display area 100 is formed by the display elements 10 arranged in a two-dimensional matrix.

The display element 10 includes, for example, an organic electroluminescence display element. Here, description will be given on the premise that a transistor that drives a light emitting unit including an organic electroluminescence element is a p-channel transistor. The description will be given on a further premise that an image becomes brighter as a video signal voltage written in a display element 10 becomes lower. Note that it is presumed that a transistor for writing a video signal voltage is an n-channel transistor.

A display element row arranged along the first direction includes display elements $10_A$ belonging to a first group and display elements $10_B$ belonging to a second group different from the first group. In the example illustrated in the drawing, in a display element row, display elements $10_A$ belonging to the first group and display elements $10_B$ belonging to the second group are alternately arranged. Note that, in the description of the present specification, display elements $10_A$ and display elements $10_B$ may not be distinguished and simply referred to as [display elements 10]. Meanwhile, a display element 10 may be referred to as a [pixel 10].

The display device 1 further includes:
 a first scanning line WSA connected to display elements $10_A$ belonging to the first group and a second scanning line WSB connected to display elements $10_B$ belonging to the second group, the first scanning line WSA and the second scanning line WSB being provided for every display element row arranged along the first direction; and
 a vertical scanner 120 that supplies a scanning signal to the first scanning line WSA and the second scanning line WSB.

A total of N×M display elements 10 are arranged in a two-dimensional matrix while connected with either a first scanning line WSA or a second scanning line WSB and a data line DTL with N display elements 10 arranged in the row direction and M display elements 10 arranged in the column direction. Note that, for convenience of illustration, 4×3 display elements are illustrated in FIG. 1.

The number of the first scanning lines WSA and the number of the second scanning lines WSB are each M. Display elements 10 in an m-th row (where m=1, 2, . . . , M) are connected to an m-th first scanning line $WSA_m$ or second scanning line $WSB_m$ and constitute one display element row (pixel row). The number of data lines DTL is N. Display elements 10 in an n-th column (where n=1, 2 . . . , N) are connected to an n-th data line $DTL_n$.

Note that, for convenience of description, it is based on the premise that data lines $DTL_{n-1}$ and $DTL_{n+1}$ are connected to display elements $10_A$ belonging to the first group, and data lines $DTL_n$ and $DTL_{n+2}$ are connected to display elements $10_B$ belonging to the second group. Similarly, data lines DTL that are not illustrated are alternately connected to display elements $10_A$ and the display elements $10_B$.

The source driver 110 includes a ramp signal generating circuit 111 and a switch circuit 112 that causes the data lines DTL to hold a voltage as of a time point when the data lines DTL and output of the ramp signal generating circuit 111 are switched from a connected state to a disconnected state. Symbol $SW_n$ denotes a switch that switches connection and disconnection between the n-th data line $DTL_n$ and the ramp signal generating circuit 111.

A video signal indicating a gradation corresponding to an image to be displayed is input to the source driver 110 from, for example, a device (not illustrated). The video signal is, for example, a low-voltage digital signal. A switch SW of the source driver 110 operates in synchronization with a ramp signal and switches a data line DTL and output of the ramp signal generating circuit 111 from the connected state to the disconnected state when a period calculated on the basis of the value of the digital signal elapses. As a result, a video signal voltage corresponding to a gradation value given by the digital signal can be held in the data line DTL.

The display device 1 is, for example, a color display device, and a group including three display elements 10 arranged in the row direction constitutes one color pixel. Therefore, where N'=N/3, N' color pixels are arranged in the row direction, M color pixels are arranged in the column direction, and a total of N'×M color pixels are arranged.

The display elements 10 are sequentially scanned by a scanning signal of the vertical scanner 120. A display element 10 positioned in an m-th row and an n-th column is hereinafter referred to as an (n, m)th display element 10.

In the display device 1, the display timing of the display elements 10 is controlled for every row to which they belong. Where a display frame rate of the display device 1 is denoted by FR (times/second), a scanning period per row (so-called horizontal scanning period) when the display device 1 is line-sequentially scanned row by row is less than (1/FR)×(1/M) seconds.

In the display device 1, the ramp signal generating circuit 111 generates at least a ramp signal used for setting a video signal voltage to display elements $10_A$ belonging to the first group and a ramp signal used for setting a video signal voltage to display elements $10_B$ belonging to the second group within a horizontal scanning period.

Moreover, when output of the ramp signal generating circuit 111 and a data line DTL are switched from the connected state to the disconnected state in order to cause the data line DTL corresponding to a certain display element 10 to hold a video signal voltage, a data line DTL corresponding to a display element 10 belonging to a group different from the group to which the certain display element 10 belongs and output of the ramp signal generating circuit 111 are switched from the disconnected state to the connected state.

More specifically, in a display element row, when output of the ramp signal generating circuit 111 and a data line DTL are switched from the connected state to the disconnected state in order to cause the data line DTL corresponding to one display element of a pair of adjacent display elements $10_A$ and $10_B$ to hold a video signal voltage, a data line DTL corresponding to the other display element of the pair of the adjacent display elements $10_A$ and $10_B$ and output of the ramp signal generating circuit 111 are switched from the disconnected state to the connected state.

The operation of the display device 1 will be described later in detail with reference to FIGS. 7 and 8 which will be described later.

Here, in order to facilitate understanding of the present disclosure, a configuration of a display device according to a reference example and a disadvantage thereof will be described.

Figure 2:
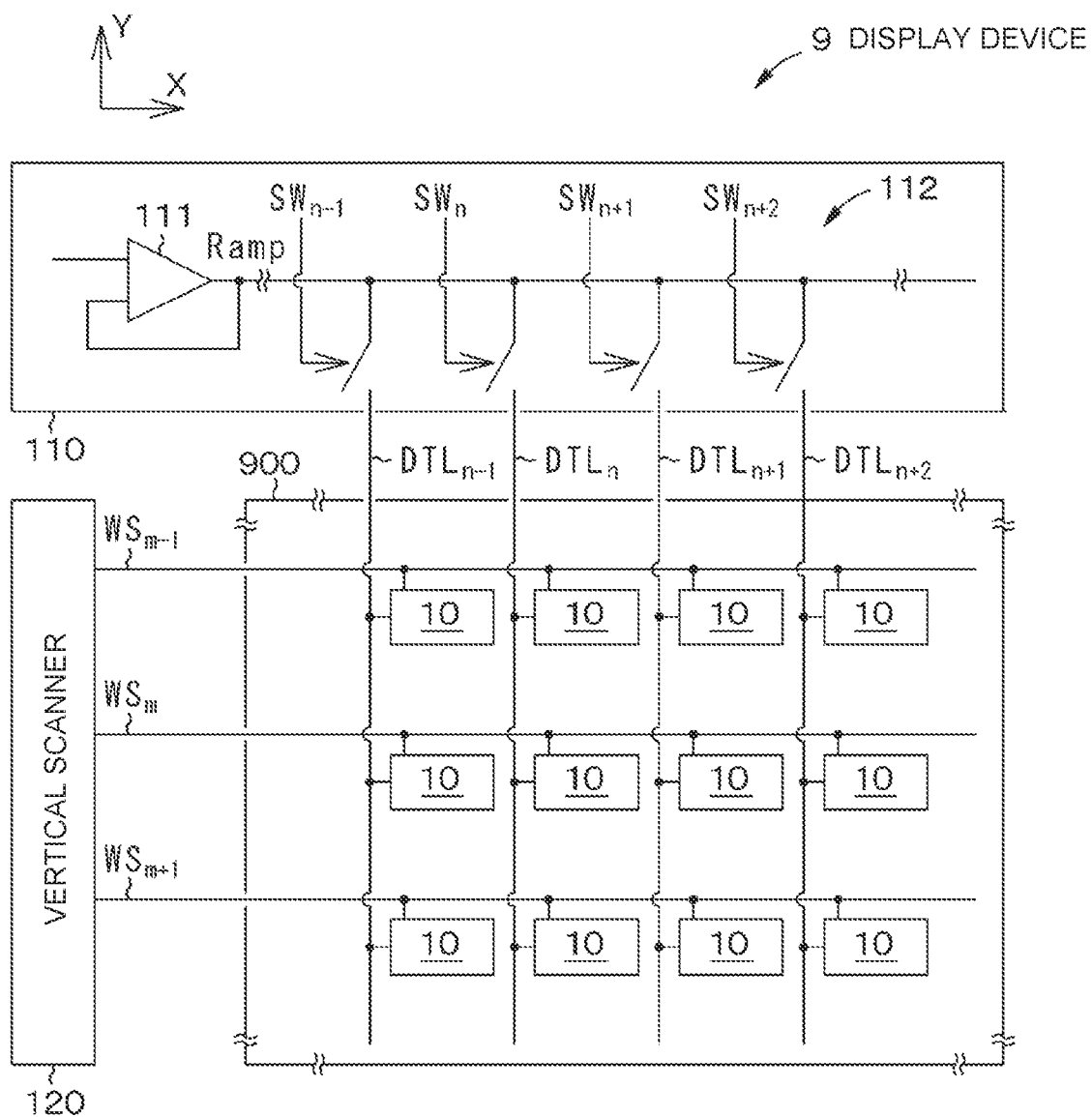
FIG. 2 is a conceptual diagram of a display device according to a reference example.

FIG. 2 is a conceptual diagram of a display device according to a reference example. In a display device 9 according to the reference example, all the display elements 10 constituting a display element row arranged along the row direction are connected to a shared scanning line WS. A display area 900 is formed by display elements 10 arranged in a two-dimensional matrix.

Figure 3:
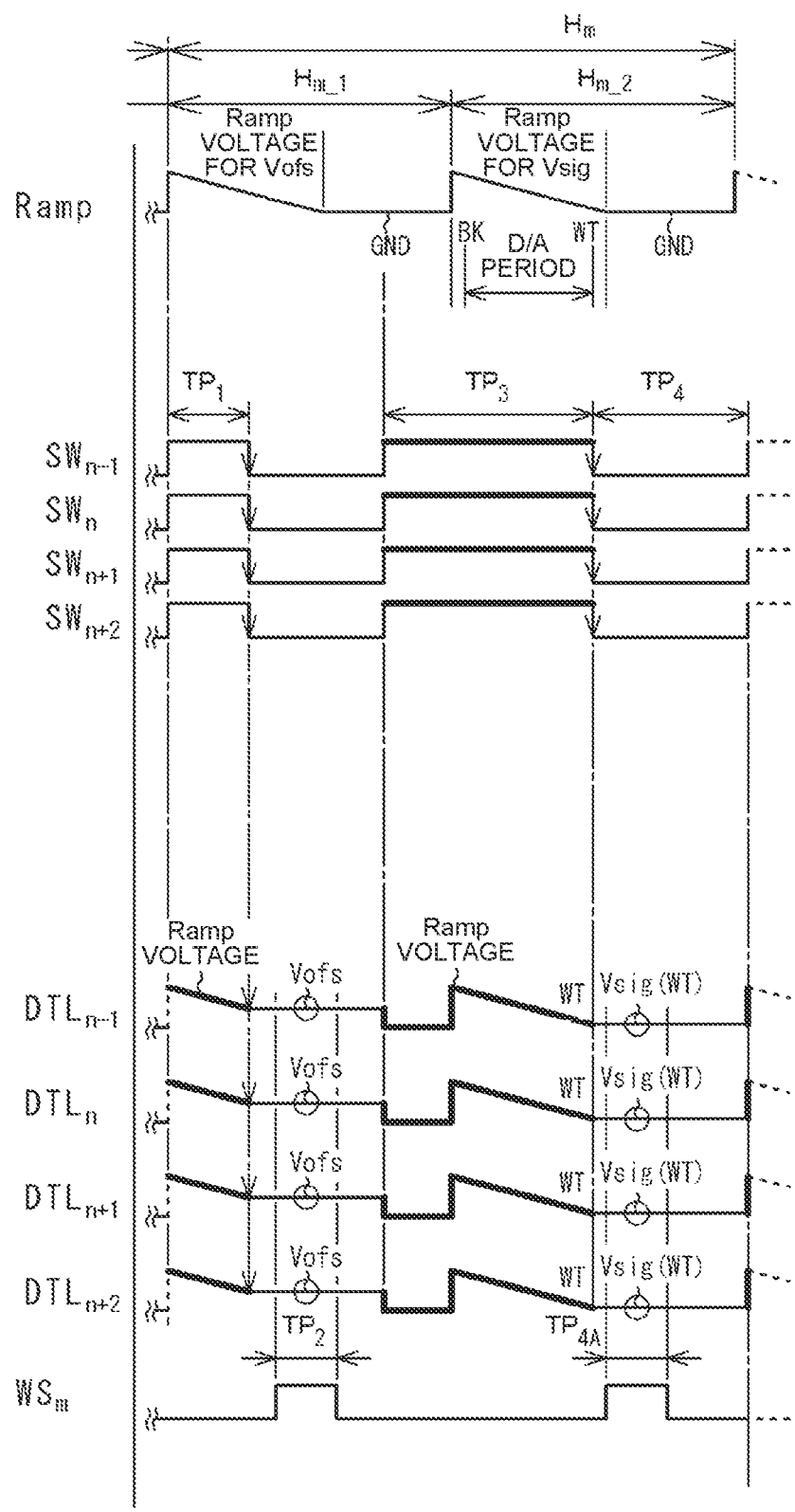
FIG. 3 is a schematic timing chart for explaining the operation in the display device according to the reference example.

FIG. 3 is a schematic timing chart for explaining the operation in the display device according to the reference example. Specifically, a timing chart when white display is performed on the entire screen is illustrated.

Symbol $H_m$ denotes a horizontal scanning period for an m-th display element row. Description will be given on the premise that the ramp signal generating circuit 111 generates a ramp signal for writing a reference voltage $V_{ofs}$ in a first half period $H_{m\_1}$ of a horizontal scanning period $H_m$ and a ramp signal for writing a video signal voltage $V_{sig}$ in a second half period $H_{m\_2}$ of the horizontal scanning period $H_m$.

When a predetermined period $TP_1$ has elapsed from the beginning of the period $H_{m\_1}$, the switches $SW_1$ to $SW_N$ are switched from a conductive state to a non-conductive state. In FIG. 3, the waveform of a data line DTL when the data line DTL and the ramp signal generating circuit 111 are in a conductive state is indicated in a bold line. The same applies to other drawings as well.

As a result, an offset voltage $V_{ofs}$ obtained by sampling the ramp signals at predetermined timing is held in the data lines $DTL_1$ to $DTL_N$. Thereafter, during a period $TP_2$, a scanning signal is supplied to the scanning line $WS_m$, and the offset voltage $V_{ofs}$ is written in all the display elements 10 belonging to the m-th row.

Note that in a case where the reference voltage $V_{ofs}$ does not need to be written, the above operation may be omitted. In other words, the first half period $H_{m\_1}$ may be omitted.

After the period $TP_2$, the switches $SW_1$ to $SW_N$ are brought into a conductive state and then are brought into a non-conductive state near the end of the ramp signal in the period $H_{m\_2}$. As a result, a video signal voltage $V_{sig\ (WT)}$ for white display obtained by sampling the ramp signals at predetermined timing is held in the data lines $DTL_1$ to $DTL_N$. Thereafter, during a period $TP_{44}$, the scanning signal is supplied to the scanning line $WS_m$, and the video signal voltage $V_{sig\ (WT)}$ for white display is written in all the display elements 10 belonging to the m-th row.

Next, an operation when black display is performed on the entire screen will be described.

Figure 4:
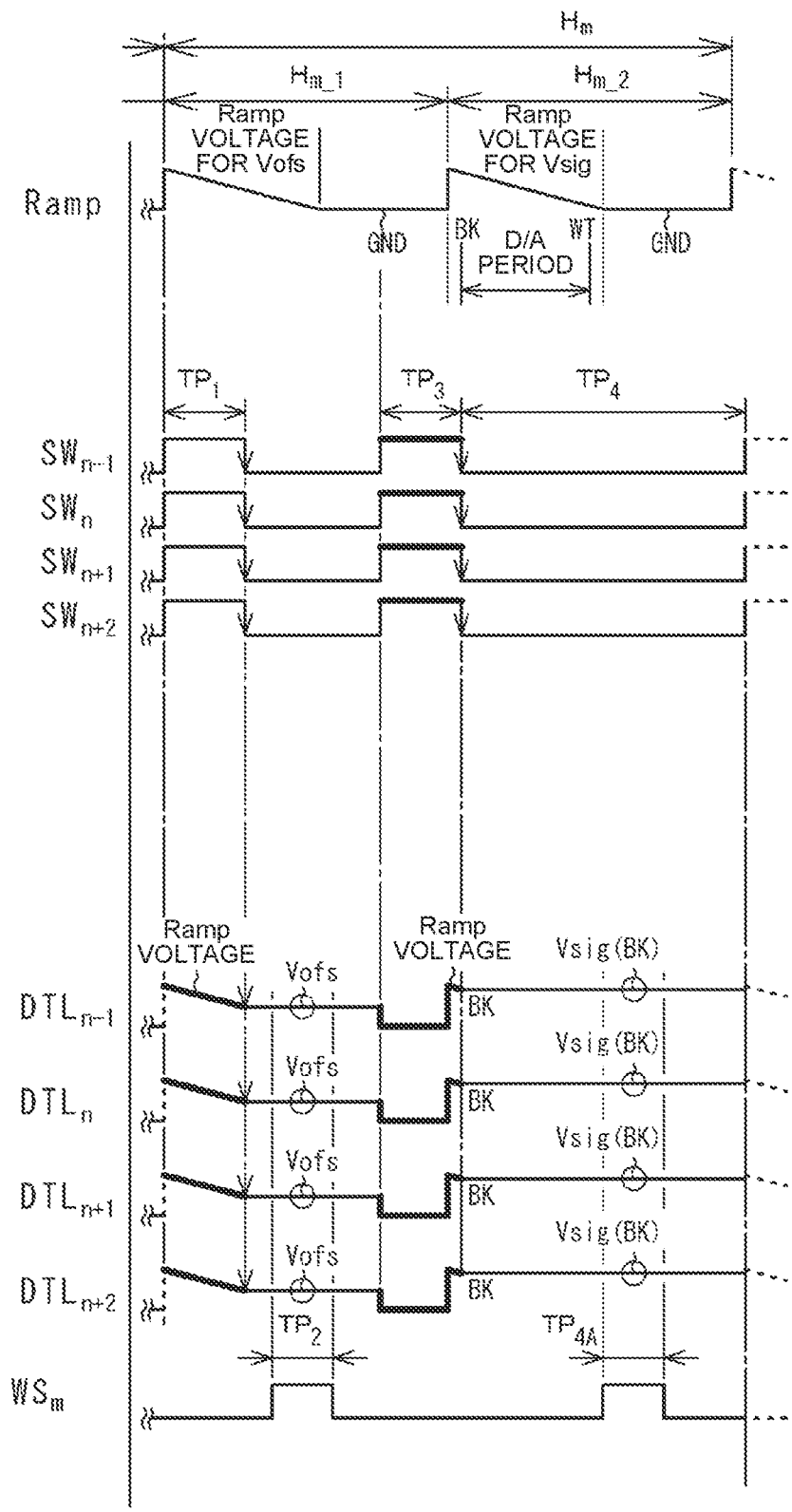
FIG. 4 is a schematic timing chart for describing the operation in the display device according to the reference example in addition to FIG. 3.

FIG. 4 is a schematic timing chart for describing the operation in the display device according to the reference example in addition to FIG. 3. Specifically, a timing chart when black display is performed on the entire screen is illustrated. Since the operation in the period $H_{m\_1}$ is similar to the operation described in FIG. 3, the description thereof will be omitted.

After the period $TP_2$, the switches $SW_1$ to $SW_N$ are brought into a conductive state and then are brought into a non-conductive state near the beginning of the ramp signal in the period $H_{m\_2}$. As a result, a video signal voltage $V_{sig\ (BK)}$ for black display obtained by sampling the ramp signals at predetermined timing is held in the data lines $DTL_1$ to $DTL_N$. Thereafter, during the period $TP_{44}$, a scanning signal is supplied to the scanning line $WS_m$, and the video signal voltage $V_{sig\ (BK)}$ for black display is written in all the display elements 10 belonging to the m-th row.

Next, an operation when white display is partially performed mainly with black display will be described.

Figure 5:
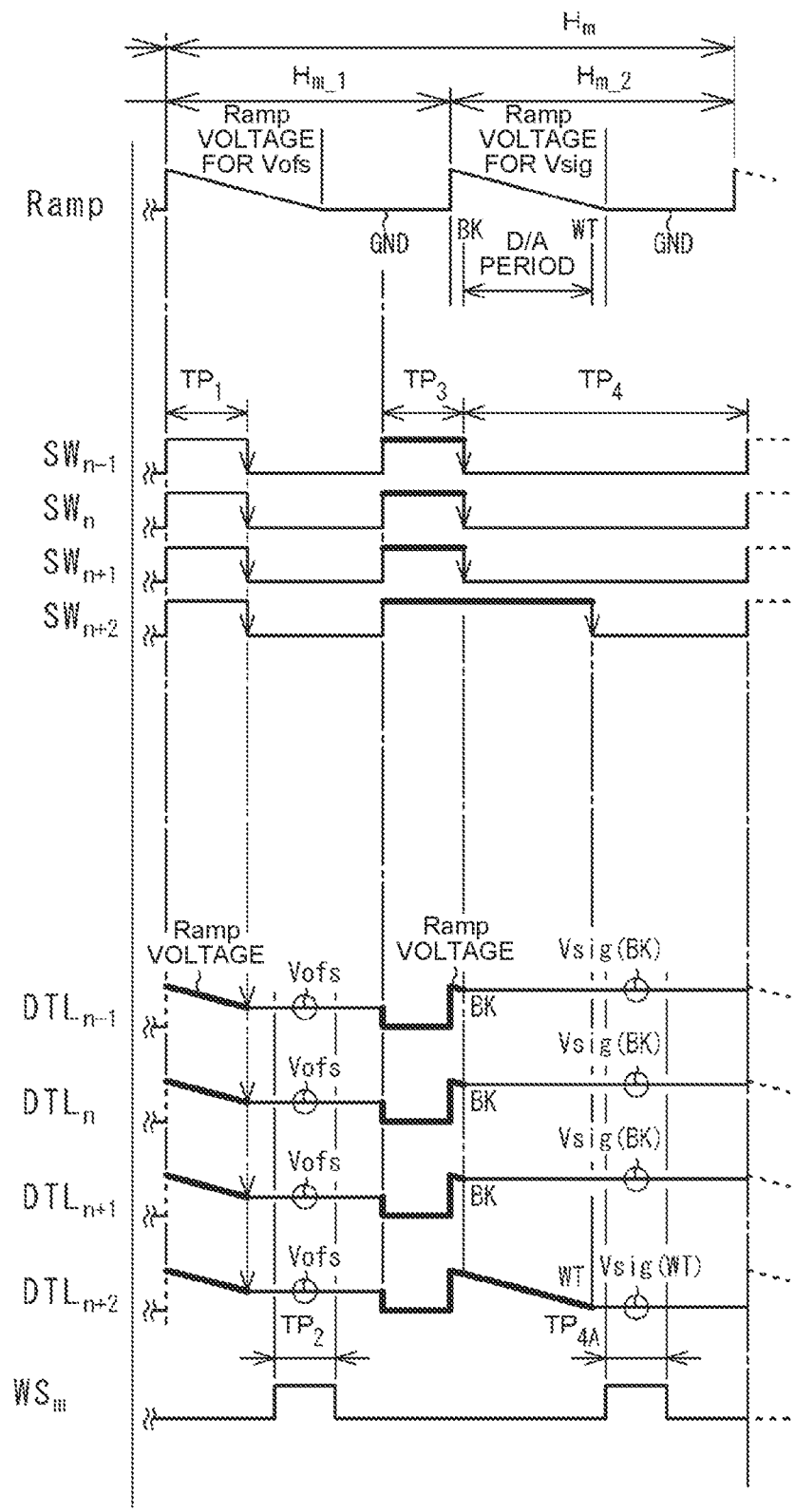
FIG. 5 is a schematic timing chart for describing the operation in the display device according to the reference example in addition to FIG. 4.

FIG. 5 is a schematic timing chart for describing the operation in the display device according to the reference example in addition to FIG. 4. Specifically, illustrated is an operation example in which only a part of the display element rows is displayed in white in mainly black display. Since the operation in the period $H_{m\_1}$ is similar to the operation described in FIG. 3, the description thereof will be omitted.

After the period $TP_2$, the switches $SW_1$ to $SW_N$ are brought into a conductive state, and then the switches SW other than a switch $SW_{n+2}$ are brought into a non-conductive state near the beginning of the ramp signal in the period $H_{m\_2}$, and the switch $SW_{n+2}$ is brought into a non-conductive state near the end of the ramp signal in the period $H_{m\_2}$.

Consequently, the video signal voltage $V_{sig(BK)}$ for black display is held in data lines DTL other than the data line $DTL_{n+2}$, and the video signal voltage $V_{sig(WT)}$ for white display is held in the data line $DTL_{n+2}$. Thereafter, during the period $TP_{44}$, a scanning signal is supplied to the scanning line $WS_m$, and the video signal voltage $V_{sig(BK)}$ of black display is written in display elements 10 other than those connected to the data line $DTL_{n+2}$ among all the display elements 10 belonging to the m-th row. Meanwhile, the video signal voltage $V_{sig(WT)}$ for white display is written in display elements 10 connected to the data line $DTL_{n+2}$.

The video signal voltage $V_{sig(WT)}$ for white display held in each data line DTL in FIG. 3 and the video signal voltage $V_{sig(WT)}$ for white display held in the data line $DTL_{n+2}$ in FIG. 5 have the same voltage if the display device 9 operates in an ideal manner. However, in FIG. 3, all the data lines DTL are connected to the ramp signal generating circuit 111 until close to the end of the ramp signal in the period $H_{m\_2}$. On the other hand, in FIG. 5, most of the data lines DTL are disconnected from the ramp signal generating circuit 111 near the beginning of the ramp signal in the period $H_{m\_2}$. Therefore, in FIGS. 3 and 5, the video signal voltage $V_{sig(WT)}$ for white display is written in a state where the loads of the ramp signals are different.

Figure 6A:
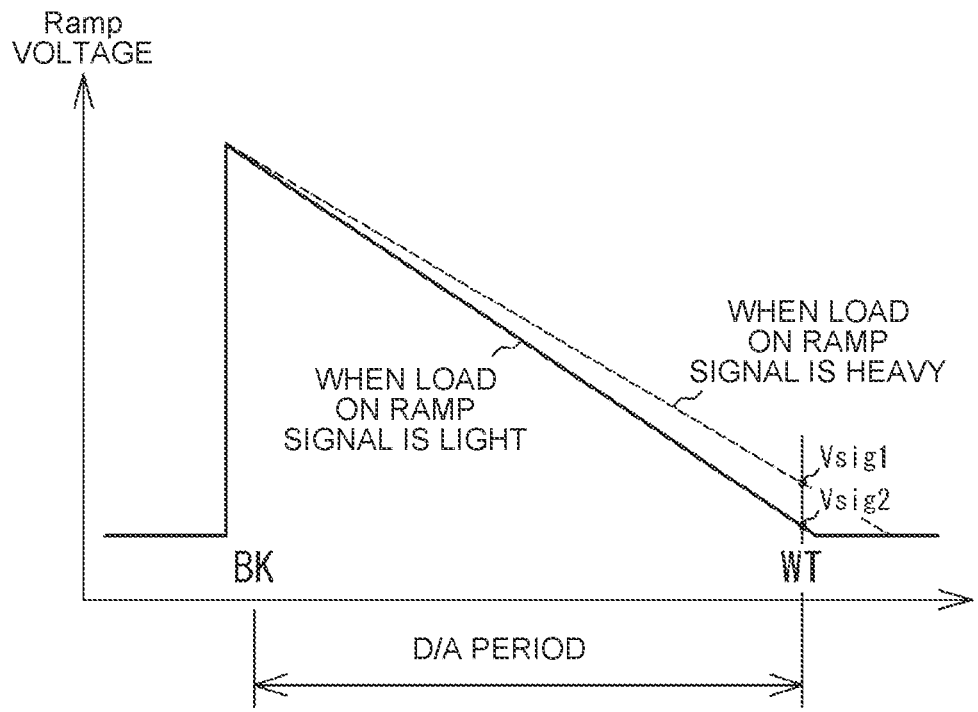
FIG. 6A is a schematic waveform diagram for explaining a waveform change caused by a difference in load on a ramp signal.
Figure 6B:
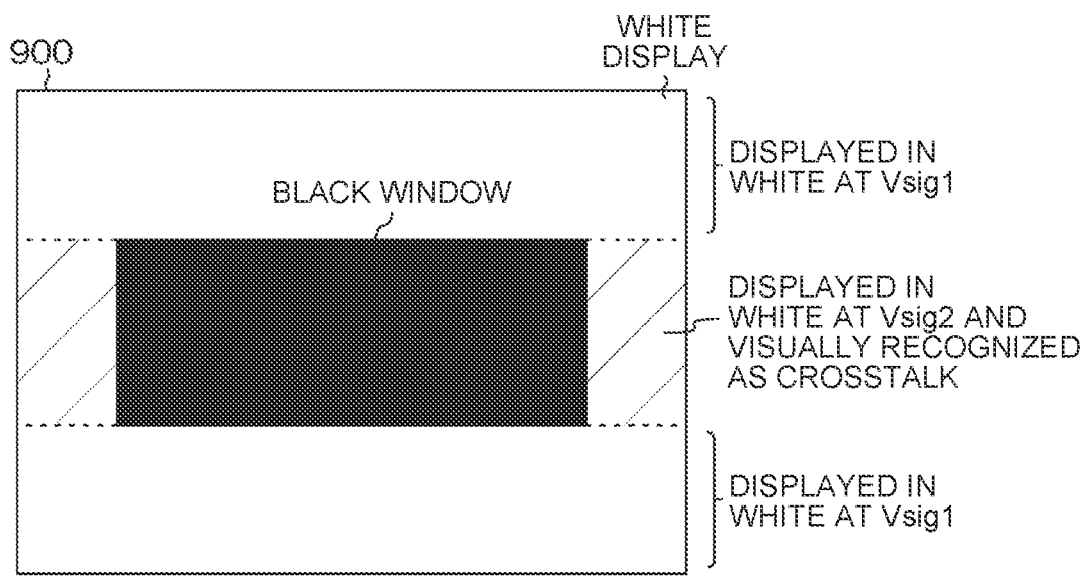
FIG. 6B is a schematic diagram for explaining crosstalk that occurs when a black window is displayed on a white display screen.

FIG. 6A is a schematic waveform diagram for explaining a waveform change caused by a difference in load on a ramp signal. FIG. 6B is a schematic diagram for explaining crosstalk that occurs when a black window is displayed on a white display screen.

As illustrated in FIG. 6A, when comparing a case where a load on the ramp signal is light and a case where the load is heavy, the inclination of the ramp signal becomes gentler as the load becomes heavier. Therefore, even if the voltage for white display is sampled at the same timing, there is a difference in the sampled voltages. FIG. 6A illustrates an example in which a voltage $V_{sig2}$ is sampled as the voltage for white display when the load is light, and a voltage $V_{sig1}$ is sampled as the voltage for white display when the load is heavy.

Therefore, for example in a case where a black window is displayed on a white display screen, a display element row that does not overlap with the black window is displayed in white at the voltage $V_{sig1}$, and display elements that performs white display in a display element row that overlaps with the black window is displayed in white at the voltage $V_{sig2}$. As a result, a portion displayed in white at the voltage $V_{sig2}$ has high luminance, which causes a disadvantage of being visually recognized as crosstalk.

The configuration of the display device according to the reference example and the disadvantage thereof have been described above.

As described above, in the display device 1, the ramp signal generating circuit 111 generates at least the ramp signal used for setting a video signal voltage to the display elements $10_A$ belonging to the first group and the ramp signal used for setting a video signal voltage to the display elements $10_B$ belonging to the second group within one horizontal scanning period. Moreover, when output of the ramp signal generating circuit 111 and a data line DTL are switched from the connected state to the disconnected state in order to cause the data line DTL corresponding to a certain display element 10 to hold a video signal voltage, a data line DTL corresponding to a display element 10 belonging to a group different from the group to which the certain display element 10 belongs and output of the ramp signal generating circuit 111 are switched from the disconnected state to the connected state. As a result, a change in the load on the ramp signals can be reduced, and thus the above-described crosstalk and the like can be reduced.

In a display element row of the display device 1, display elements $10_A$ belonging to the first group and display elements $10_B$ belonging to the second group are alternately arranged. In a display element row, when output of the ramp signal generating circuit 111 and a data line DTL are switched from the connected state to the disconnected state in order to cause the data line DTL corresponding to one display element of a pair of adjacent display elements $10_A$ and $10_B$ to hold a video signal voltage, a data line DTL corresponding to the other display element of the pair of the adjacent display elements $10_A$ and $10_B$ and output of the ramp signal generating circuit 111 are switched from the disconnected state to the connected state.

Hereinafter, the operation of the display device 1 will be described in detail.

A drive method of the display device 1 includes the steps of:
by the ramp signal generating circuit 111, generating, in one horizontal scanning period, at least a ramp signal used for setting a video signal voltage to the display elements $10_A$ belonging to the first group and a ramp signal used for setting a video signal voltage to the display elements $10_B$ belonging to the second group; and when output of the ramp signal generating circuit 111 and a data line DTL are switched from the connected state to the disconnected state in order to cause the data line DTL corresponding to a certain display element 10 to hold a video signal voltage, a data line DTL corresponding to a display element 10 belonging to a group different from the group to which the certain display element 10 belongs and output of the ramp signal generating circuit 111 are switched from the disconnected state to the connected state.

Figure 7:
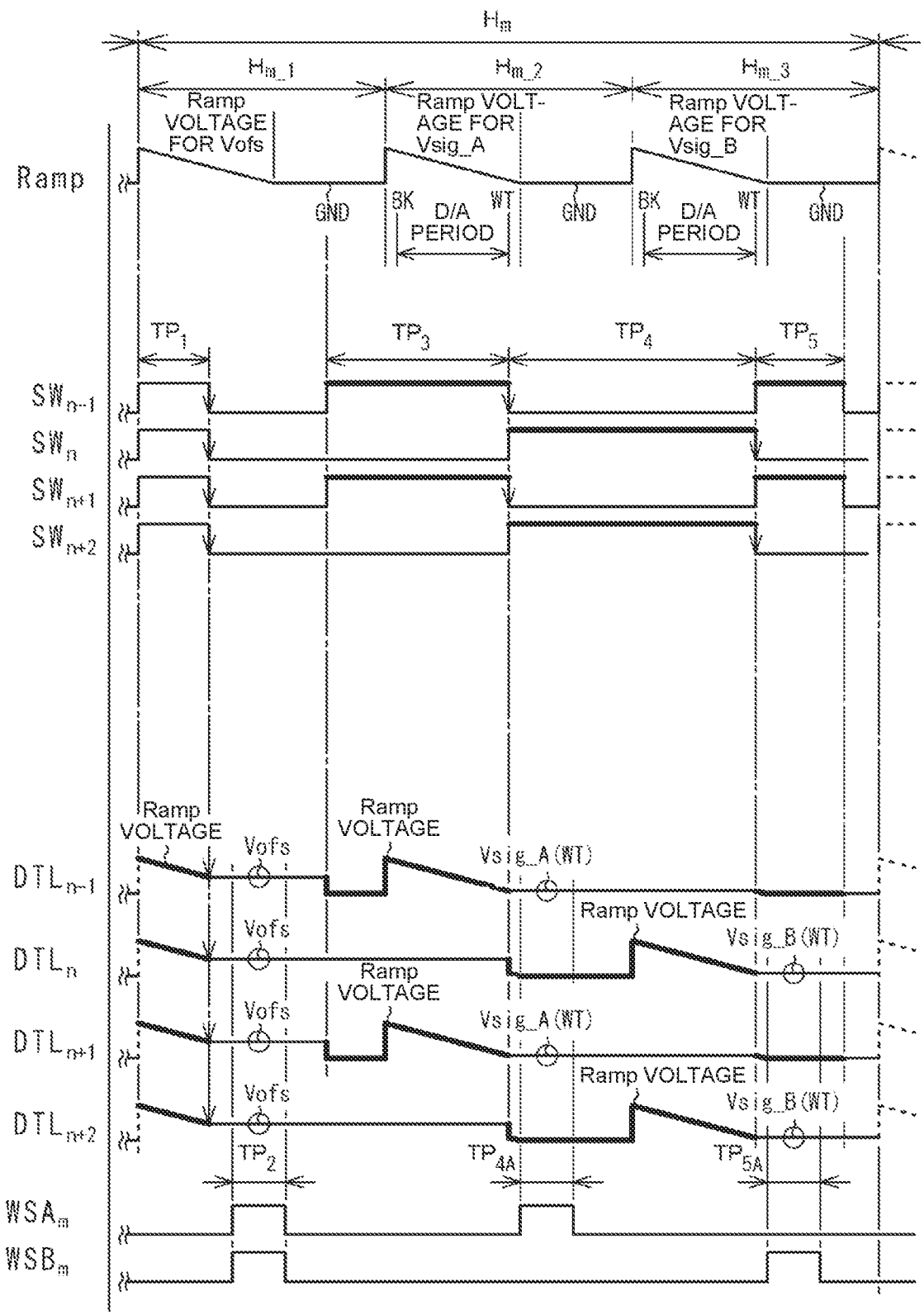
FIG. 7 is a schematic timing chart for explaining the operation in the display device according to the first embodiment.

FIG. 7 is a schematic timing chart for explaining the operation in the display device according to the first embodiment. Specifically, a timing chart when white display is performed on the entire screen is illustrated.

Symbol $H_m$ denotes a horizontal scanning period for an m-th display element row. In the display device 1, a horizontal scanning period $H_m$ includes an earlier period $H_{m-1}$, a middle period $H_{m-2}$, and a latter period $H_{m-2}$.

The ramp signal generating circuit 111 generates a ramp signal for writing the reference voltage $V_{ofs}$ in the earlier period $H_{m\_1}$. The operation in the period $H_{m\_1}$ is substantially similar to the operation of the reference example described with reference to FIG. 3. That is, during the period $TP_2$, a scanning signal is supplied to the first scanning line $WSA_m$ and the second scanning line $WSB_m$, and the offset voltage $V_{ofs}$ is written in all the display elements 10 belonging to the m-th row.

Note that, similarly to the reference example, in a case where the reference voltage $V_{ofs}$ does not need to be written, the above operation may be omitted. In other words, the first half period $H_{m\_1}$ may be omitted.

After the period $TP_2$, switches SW (in FIG. 7, switches $SW_{n-1}$ and $SW_{n+1}$) corresponding to the data lines DTL connected to the display elements $10_A$ of the first group are brought into the conductive state at the beginning of the period $TP_3$. Switches SW (in FIG. 7, switches $SW_n$ and $SW_{n+2}$) corresponding to the data lines DTL connected to the display elements $10_B$ of the second group maintain the non-conductive state. Note that the beginning of the period $TP_3$ serves as a reference in sampling. Therefore, the beginning is fixed so as to be at predetermined timing.

As described below, when output of the ramp signal generating circuit 111 and a data line DTL are switched from the connected state to the disconnected state in order to cause the data line DTL corresponding to one display element of a pair of adjacent display elements $10_A$ and $10_B$ to hold a video signal voltage, a data line DTL corresponding to the other display element of the pair of the adjacent display elements $10_A$ and $10_B$ and output of the ramp signal generating circuit 111 are switched from the disconnected state to the connected state.

In the display device 1, the connection states of the data lines $DTL_{n-1}$ and $DTL_n$ are complementarily switched, and the connection states of the data lines $DTL_n$ and $DTL_{n+1}$ are complementarily switched. However, the configuration of the present disclosure is not limited to this.

In the middle period $H_{m\_2}$, the ramp signal generating circuit 111 generates a ramp signal used for setting a video signal voltage to the display elements $10_A$ belonging to the first group. The output of the ramp signal generating circuit 111 is supplied to the data lines DTL (in FIG. 7, data lines $DTL_{n-1}$ and $DTL_{n+1}$) connected to the display elements $10_A$ of the first group.

The switches $SW_{n-1}$ and $SW_{n+1}$ corresponding to the data lines DTL connected to the display elements $10_A$ of the first group are brought into the non-conductive state near the end of the ramp signal in the middle period $H_{m\_2}$ (the end of the period TP$_3$). As a result, a video signal voltage V$_{sig\_A(WT)}$ for white display obtained by sampling the ramp signal at predetermined timing is held in the data lines DTL$_{n-1}$ and DTL$_{n+1}$ connected to the display elements 10$_A$ of the first group.

In addition, at the end of the period TP$_3$ (that is, the beginning of the period TP$_4$), the switches SW$_n$ and SW$_{n+2}$ corresponding to data lines DTL connected to display elements 10$_B$ of the second group are brought into a conductive state.

Thereafter, during the period TP$_{4A}$, a scanning signal is supplied to the first scanning line WSA$_m$, and the video signal voltage V$_{sig\_A(WT)}$ for white display is written in display elements 10$_A$ of the first group belonging to the m-th row.

In the latter period H$_{m\_3}$, the ramp signal generating circuit 111 generates a ramp signal used for setting a video signal voltage to the display elements 10$_B$ belonging to the second group. The output of the ramp signal generating circuit 111 is supplied to the data lines DTL (in FIG. 7, data lines DTL$_n$ and DTL$_{n+2}$) connected to the display elements 10$_B$ of the second group.

The switches SW$_n$ and SW$_{n+2}$ corresponding to the data lines DTL connected to the display elements 10$_B$ of the second group are brought into the non-conductive state near the end of the ramp signal in the latter period H$_{m\_3}$ (the end of the period TP$_4$). As a result, a video signal voltage V$_{sig\_B(WT)}$ for white display obtained by sampling the ramp signal at predetermined timing is held in the data lines DTL$_{n-1}$ and DTL$_{n+1}$ connected to the display elements 10$_A$ of the first group.

In addition, at the end of the period TP$_4$ (that is, the beginning of the period TP$_5$), the switches SW$_{n-1}$ and SW$_{n+1}$ corresponding to the data lines DTL connected to display elements 10$_A$ of the first group are brought into the conductive state and are maintained in the conductive state until the end of the period TP$_5$. The end of the period TP$_5$ is fixed at predetermined timing.

Thereafter, during the period TP$_{5A}$, a scanning signal is supplied to the second scanning line WSB$_m$, and the video signal voltage V$_{sig\_B(WT)}$ for white display is written in display elements 10 of the second group belonging to the m-th row.

Here, let us look at the connection relationship between the data lines DTL$_{n-1}$ to DTL$_{n+2}$ and the ramp signal generating circuit 111 in a period from the beginning of the period TP$_3$ to the end of the period TP$_5$. Focusing on a pair of the data lines DTL$_{n-1}$ and DTL$_n$, a state in which one of the data lines DTL is connected to the ramp signal generating circuit 111 lasts during the period TP$_3$ and the period TP$_4$. The same applies to a pair of the data lines DTL$_{n+1}$ and DTL$_{n+2}$.

That is, in the operation illustrated in FIG. 7, in the period from the beginning of the period TP$_3$ to the end of the period TP$_5$, a state in which substantially N/2 data lines DTL are connected to the ramp signal generating circuit 111 is maintained.

Next, an operation when black display is performed on the entire screen will be described.

Figure 8:
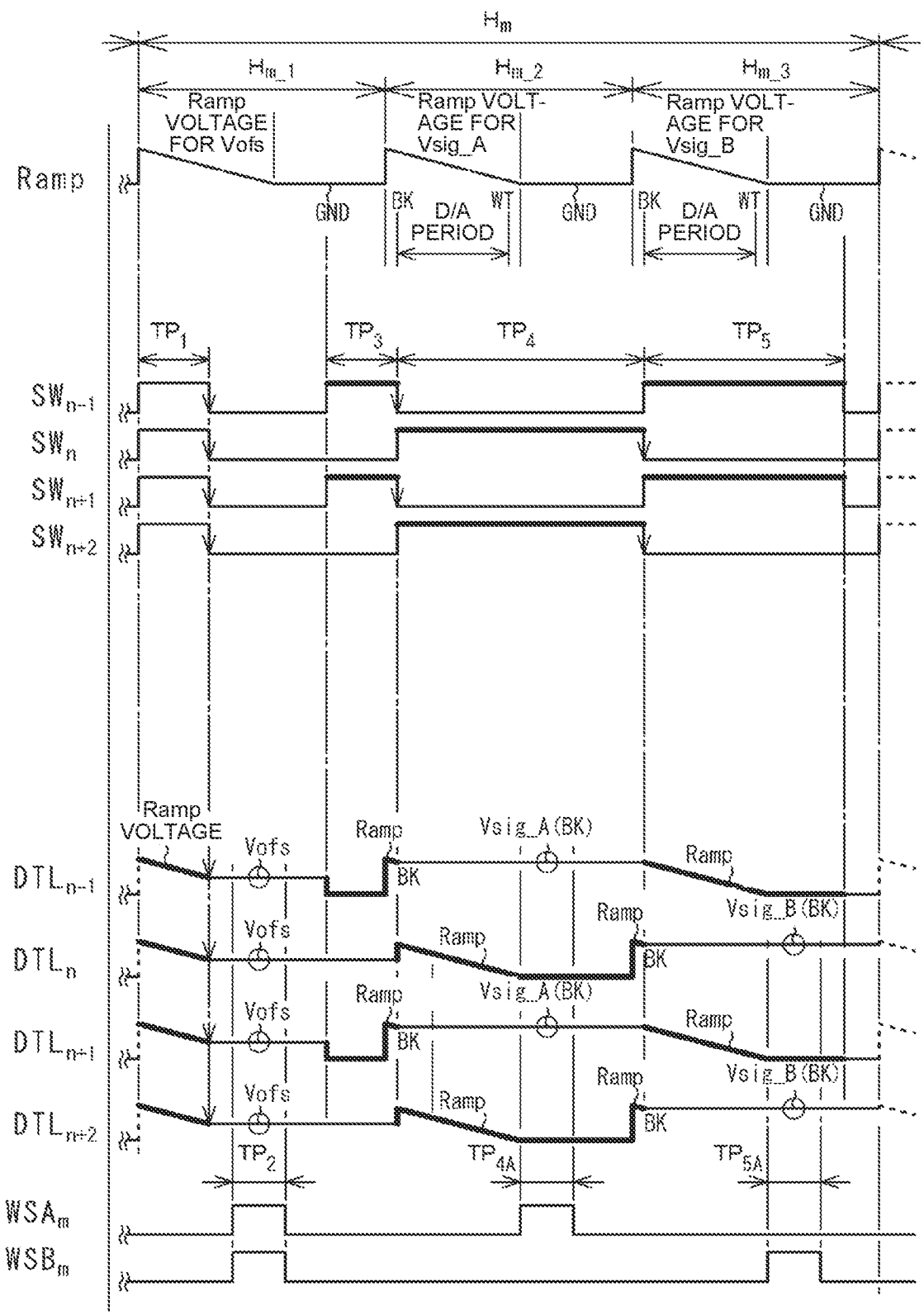
FIG. 8 is a schematic timing chart for describing the operation in the display device according to the first embodiment in addition to FIG. 7.

FIG. 8 is a schematic timing chart for describing the operation in the display device according to the first embodiment in addition to FIG. 7. Specifically, a timing chart when black display is performed on the entire screen is illustrated.

After the period TP$_2$, the switches SW$_{n-1}$ and SW$_{n+1}$ corresponding to the data lines DTL connected to the display elements 10$_A$ of the first group are brought into the conductive state at the beginning of the period TP$_3$. The switches SW$_n$ and SW$_{n+2}$ corresponding to the data lines DTL connected to the display elements 10$_B$ of the second group maintain the non-conductive state.

In the middle period H$_{m\_2}$, the ramp signal generating circuit 111 generates a ramp signal used for setting a video signal voltage to the display elements 10$_A$ belonging to the first group. The output of the ramp signal generating circuit 111 is supplied to the data lines DTL$_{n-1}$ and DTL$_{n+1}$ connected to the display elements 10$_A$ of the first group.

The switches SW$_{n-1}$ and SW$_{1+1}$ corresponding to the data lines DTL connected to the display elements 10$_A$ of the first group are brought into the non-conductive state near the beginning of the ramp signal in the middle period H$_{m\_2}$ (the end of the period TP$_3$). As a result, a video signal voltage V$_{sig\_A(BK)}$ for black display obtained by sampling the ramp signal at predetermined timing is held in the data lines DTL$_{n-1}$ and DTL$_{n+1}$ connected to the display elements 10$_A$ of the first group.

In addition, at the end of the period TP$_3$ (that is, the beginning of the period TP$_4$), the switches SW$_n$ and SW$_{n+2}$ corresponding to data lines DTL connected to display elements 10$_B$ of the second group are brought into a conductive state.

Thereafter, during the period TP$_{4A}$, a scanning signal is supplied to the first scanning line WSA$_m$, and the video signal voltage V$_{sig\_A(BK)}$ for black display is written in display elements 10 of the first group belonging to the m-th row.

In the latter period H$_{m\_3}$, the ramp signal generating circuit 111 generates a ramp signal used for setting a video signal voltage to the display elements 10$_B$ belonging to the second group. The output of the ramp signal generating circuit 111 is supplied to the data lines DTL DTL$_n$ and DTL$_{n+2}$ connected to the display elements 10$_B$ of the second group.

The switches SW$_n$ and SW$_{n+2}$ corresponding to the data lines DTL connected to the display elements 10$_B$ of the second group are brought into the non-conductive state near the beginning of the ramp signal in the latter period H$_{m\_3}$ (the end of the period TP$_4$). As a result, a video signal voltage V$_{sig\_B(BK)}$ for black display obtained by sampling the ramp signal at predetermined timing is held in the data lines DTL$_n$ and DTL$_{n+2}$ connected to the display elements 10$_B$ of the second group.

In addition, at the end of the period TP$_4$ (that is, the beginning of the period TP$_5$), the switches SW$_{n-1}$ and SW$_{n+1}$ corresponding to data lines DTL connected to display elements 10$_A$ of the first group are brought into the conductive state.

Thereafter, during the period TP$_{5A}$, a scanning signal is supplied to the second scanning line WSB$_m$, and the video signal voltage V$_{sig\_(BK)}$ for black display is written in the display elements 10 of the second group belonging to the m-th row.

Here, let us look at the connection relationship between the data lines DTL$_{n-1}$ to DTL$_{n+2}$ and the ramp signal generating circuit 111 in a period from the beginning of the period TP$_3$ to the end of the period TP$_5$. Focusing on a pair of the data lines DTL$_{n-1}$ and DTL$_n$, a state in which one of the data lines DTL is connected to the ramp signal generating circuit 111 lasts during the period TP$_3$ and the period TP$_4$. The same applies to a pair of the data lines DTL$_{n+1}$ and DTL$_{n+2}$.

That is, also in the operation illustrated in FIG. 8, in the period from the beginning of the period TP$_3$ to the end of the period TP$_5$, a state in which substantially N/2 data lines DTL are connected to the ramp signal generating circuit 111 is maintained. Although a timing chart and the like are omitted, in the display device 1, a state in which substantially N/2 data lines DTL are connected to the ramp signal generating circuit 111 is maintained in the period from the beginning of the period $TP_3$ to the end of the period $TP_5$ regardless of an image to be displayed.

As described above, in the display device 1, in the period from the beginning of the period $TP_3$ to the end of the period $TP_5$, the state in which substantially N/2 data lines DTL are connected to the ramp signal generating circuit 111 is maintained. Therefore, the load of the ramp signal is averaged regardless of the type of image to be displayed.

Figure 9A:
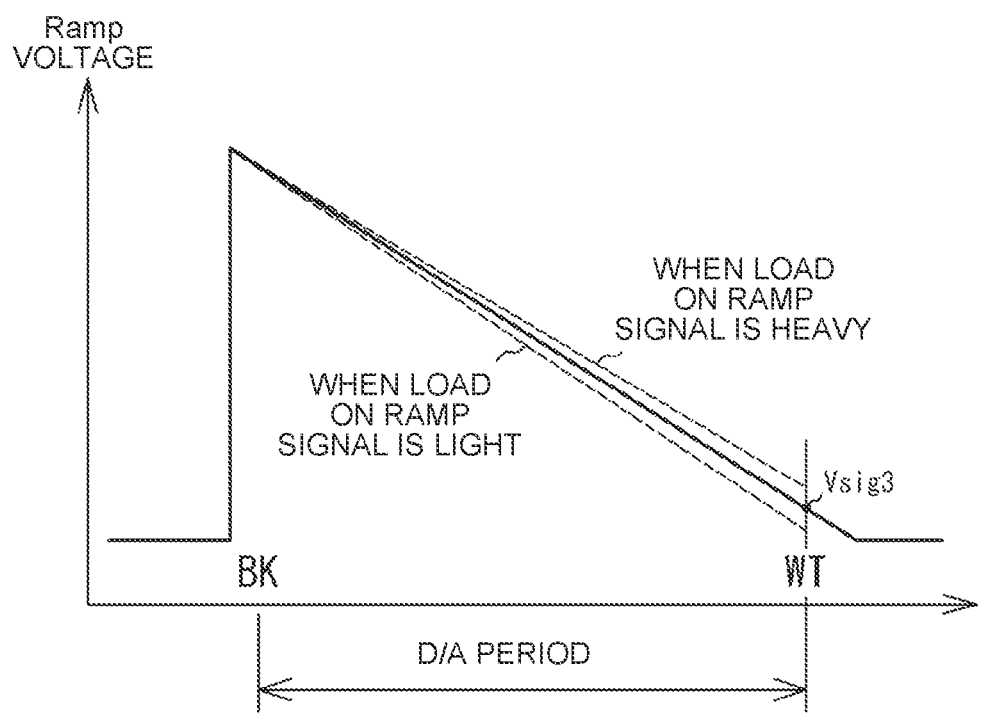
FIG. 9A is a schematic waveform diagram for explaining a waveform change due to averaging of loads on a ramp signal.
Figure 9B:
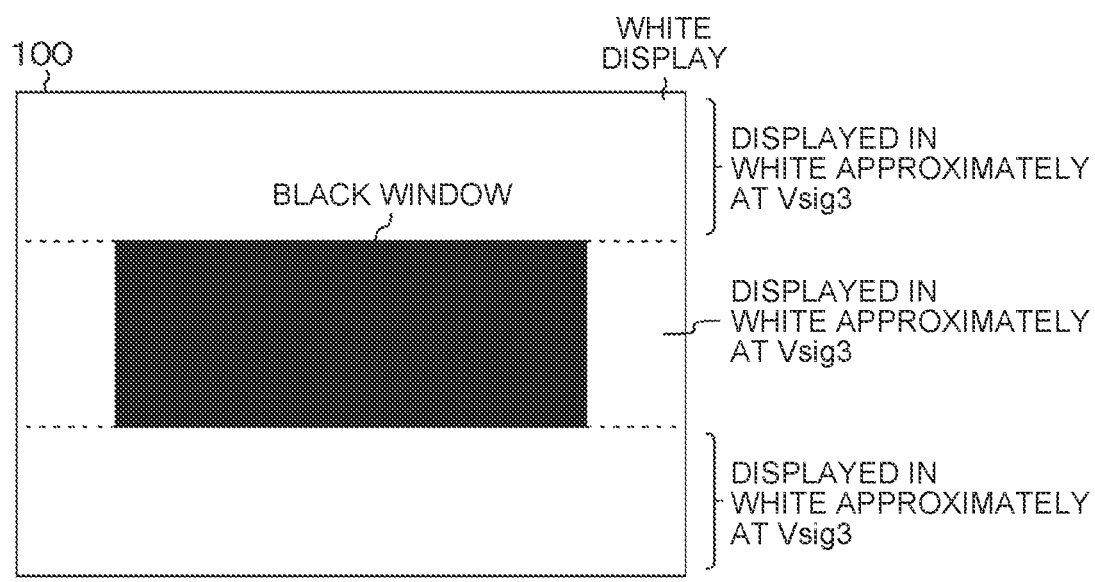
FIG. 9B is a schematic diagram for explaining a reduction in crosstalk that occurs when a black window is displayed on a white display screen.

FIG. 9A is a schematic waveform diagram for explaining a waveform change due to averaging of loads on a ramp signal. FIG. 9B is a schematic diagram for explaining a reduction in crosstalk that occurs when a black window is displayed on a white display screen.

As illustrated in FIG. 9A, in a case where the load on the ramp signal is averaged, a substantially similar voltage $V_{sig3}$ is sampled when a voltage for white display is sampled at the same timing regardless of the type of an image to be displayed.

Therefore, for example in a case where a black window is displayed on a white display screen, a display element row that does not overlap with the black window is displayed in white approximately at the voltage $V_{sig3}$, and display elements that performs white display in a display element row that overlaps with the black window is displayed in white approximately at the voltage $V_{sig3}$. As a result, visually recognizing, as crosstalk, the portion of the white display adjacent to the black window on its left and right is mitigated.

[First Modification]

A first modification also relates to a display device, a drive method for the display device, and an electronic apparatus.

Figure 10:
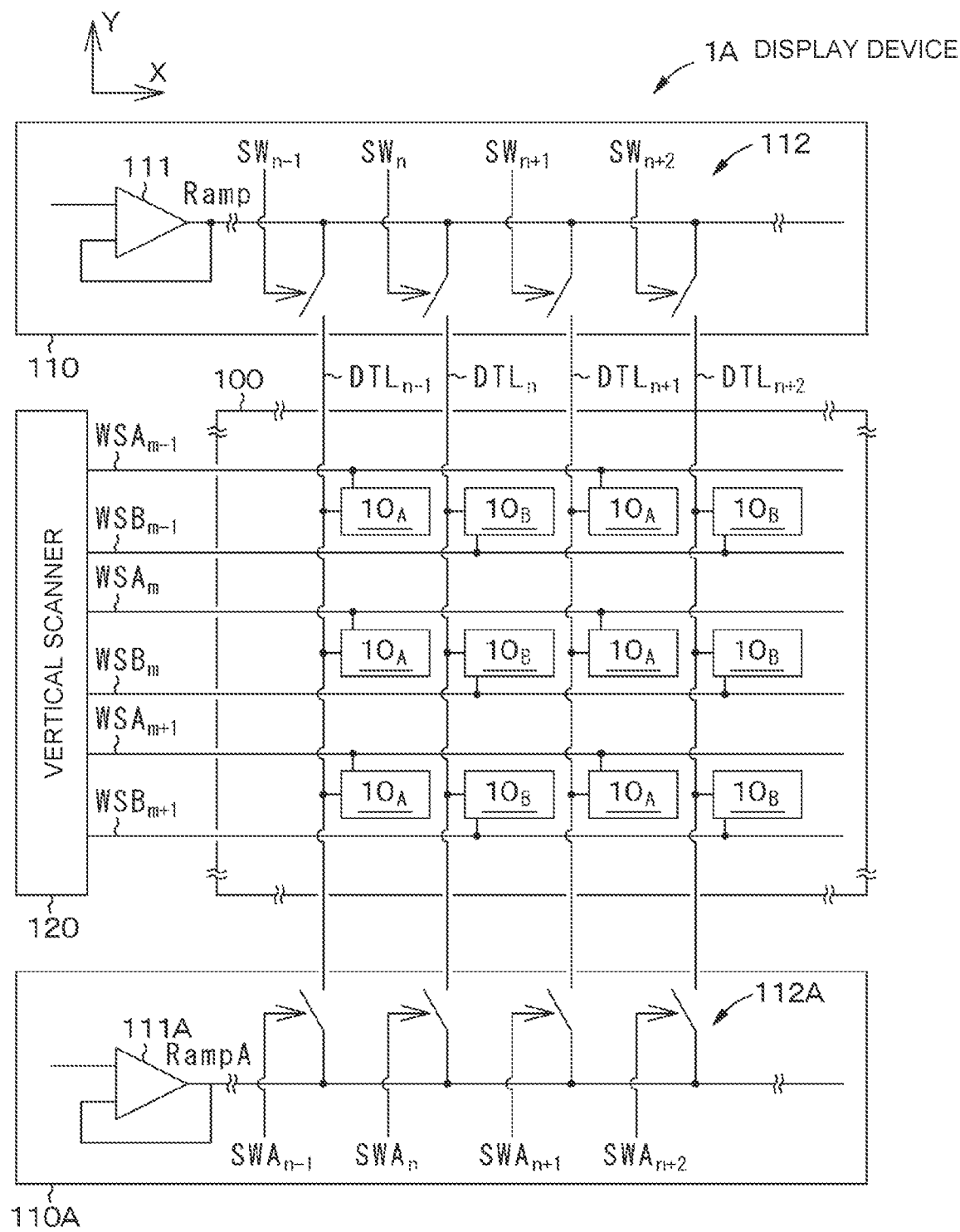
FIG. 10 is a conceptual diagram of a display device according to a first modification.

FIG. 10 is a conceptual diagram of the display device according to the first modification.

In contrast to the display device 1 illustrated in FIG. 1, the display device 1A illustrated in FIG. 10 further includes a second source driver 110A. The source driver 110 and second source driver 110A are disposed on one end side and the other end side of each of the data lines DTL, respectively.

Moreover, the second source driver 110A supplies a signal corresponding to a ramp signal of the source driver 110 to the data lines DTL before a data line DTL corresponding to a display element belonging to a group different from a group to which a certain display element belongs and output of the ramp signal generating circuit 111 are switched from the disconnected state to the connected state.

The second source driver 110A basically has a similar configuration to that of the source driver 110 and includes a ramp signal generating circuit 111A and a switch circuit 112A. A switch included in the switch circuit 112A is indicated by symbol SWA.

In the display device 1, it has been described that the connection states of the data lines $DTL_{n-1}$ and $DTL_n$ are complementarily switched and the connection states of the data lines $DTL_n$ and $DTL_{n+1}$ are complementarily switched from the beginning of the period $TP_2$ to the end of the period $TP_5$. As is apparent from the operations in FIGS. 7 and 8, immediately before a pair of data lines DTL is connected to the ramp signal generating circuit 111, the data lines DTL are in a state of holding some voltage.

To be brought into connection in a state where the voltage held by a data line DTL is different from the voltage of the ramp signal of the ramp signal generating circuit 111 can cause disturbance in the ramp signal waveform. Therefore, in the first modification, before data lines DTL and output of the ramp signal generating circuit 111 are switched from the disconnected state to the connected state, a signal corresponding to the ramp signal of the source driver is supplied to the data lines DTL.

Figure 11:
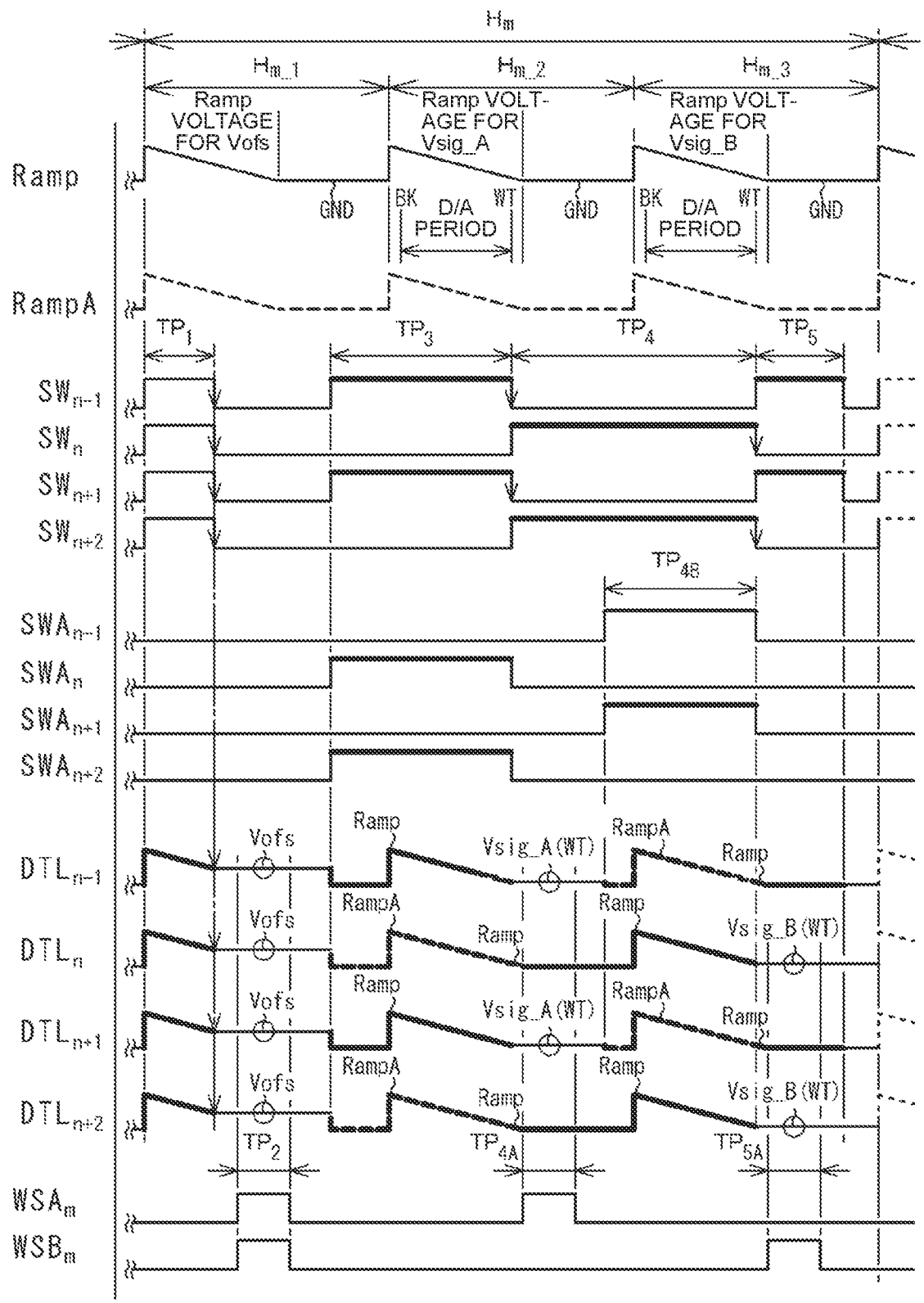
FIG. 11 is a schematic timing chart for describing the operation in the display device according to the first modification.

FIG. 11 is a schematic timing chart for describing the operation in the display device according to the first modification. Specifically, a timing chart when white display is performed on the entire screen is illustrated.

Since FIG. 11 corresponds to FIG. 7, differences will be described. During the period $TP_3$, switches $SWA_n$ and $SWA_{n+2}$ are brought into a conductive state. A voltage is supplied to $DTL_n$ and $DTL_{n+2}$ from the ramp signal generating circuit 111A of the second source driver 110A.

The operation in the period $TP_4$ is similar to that in FIG. 7. However, $DTL_n$ and $DTL_{n+2}$ are connected in a state where the voltage held therein matches the voltage of the ramp signal of the ramp signal generating circuit 111.

In addition, during a period $TP_{4B}$, switches $SWA_{n-1}$ and $SWA_{n+1}$ are in a conductive state. A voltage is supplied to $DTL_{n-1}$ and $DTL_{n+1}$ from the ramp signal generating circuit 111A of the second source driver 110A.

The operation in the period $TP_5$ is similar to that in FIG. 7. However, $DTL_{n-1}$ and $DTL_{n+1}$ are connected in a state where the voltage held therein matches the voltage of the ramp signal of the ramp signal generating circuit 111.

Figure 12:
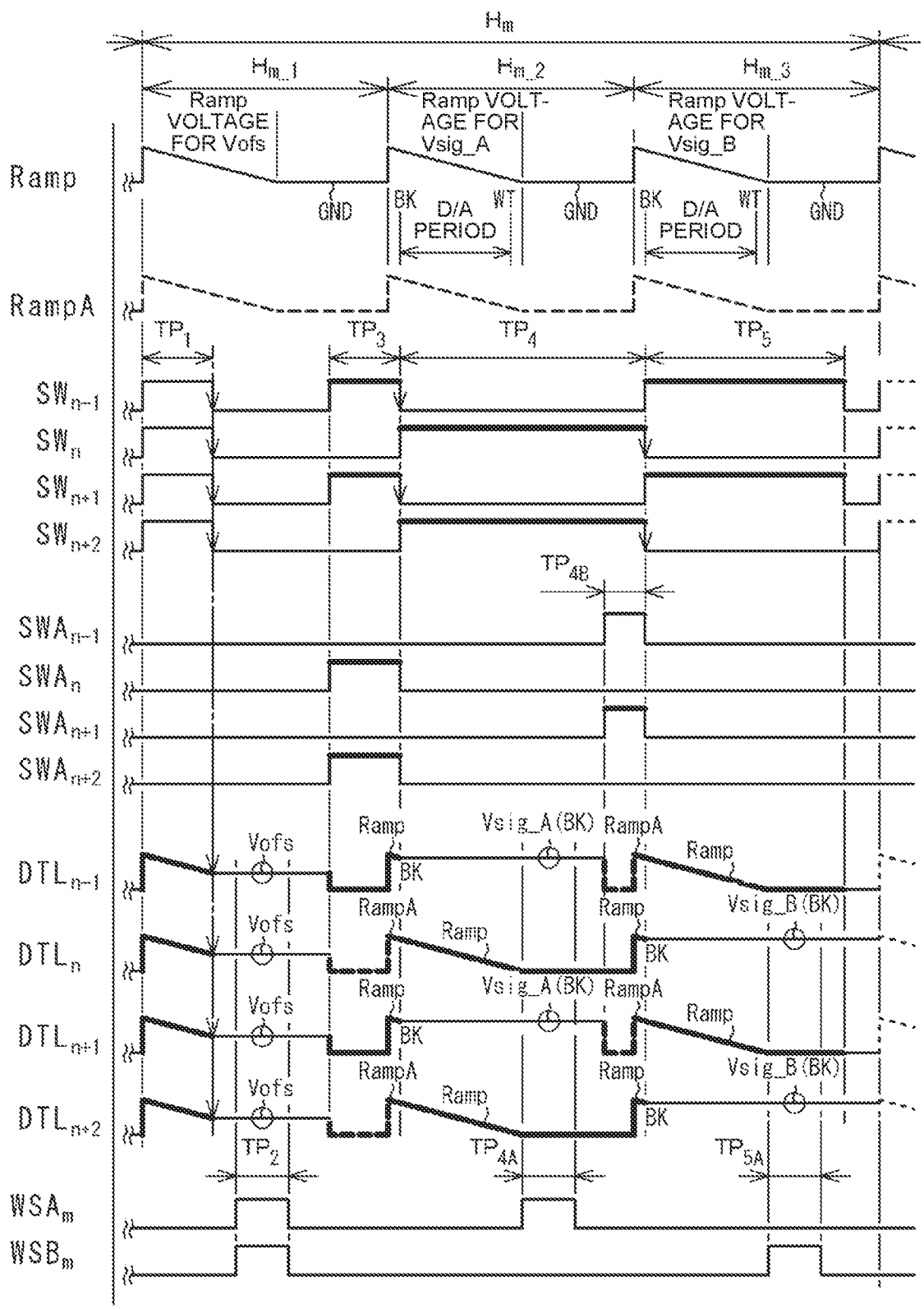
FIG. 12 is a schematic timing chart for describing the operation in the display device according to the first modification in addition to FIG. 11.

FIG. 12 is a schematic timing chart for describing the operation in the display device according to the first modification. Specifically, a timing chart when black display is performed on the entire screen is illustrated.

FIG. 12 corresponds to FIG. 8. The differences are similar to those described above. In the period $TP_4$, $DTL_n$ and $DTL_{n+2}$ are connected in a state where the voltage held therein matches the voltage of the ramp signal of the ramp signal generating circuit 111. Also in the period $TP_5$, $DTL_{n-1}$ and $DTL_{n+1}$ are connected in a state where the voltage held therein matches the voltage of the ramp signal of the ramp signal generating circuit 111.

In the first modification, switching is performed in a state in which the voltage held by the data lines DTL matches the voltage of the ramp signal of the ramp signal generating circuit 111. Therefore, the disturbance is hardly generated in the ramp signal waveform at the time of switching, and thus the display quality can be further improved.

Although the embodiment of the present disclosure has been described above, the present disclosure is not limited to the above embodiment and can be variously modified on the basis of the technical ideas of the present disclosure. For example, the numerical values, structures, processes, and the like mentioned in the above embodiment are merely examples, and numerical values, structures, processes, and the like different from these may be used as necessary.

Note that the effects described herein are merely examples and are not limiting, and other effects may also be achieved.

[Description of Electronic Apparatus, and Others]

The display device of the present disclosure described above can be used as a display unit (display device) of an electronic apparatus in any field that displays a video signal input to the electronic apparatus or a video signal generated in the electronic apparatus as an image or a video. As an example, it can be used as a display unit of, for example, a television set, a digital still camera, a laptop personal computer, a mobile terminal device such as a mobile phone, a video camera, a head mounted display (display of a head mounted type), or the like.

The display device of the present disclosure also includes one having a module shape of a sealed configuration. As an example, a display module, formed by attaching a facing unit such as transparent glass to a pixel array unit, is applicable. Note that the display module may include a circuit unit for inputting and outputting signals and the like from the outside to the pixel array unit, a flexible printed circuit (FPC), and the like. Hereinafter, a digital still camera and a head mounted display will be illustrated as specific examples of an electronic apparatus using the display device of the present disclosure. However, the specific examples illustrated herein are merely examples, and it is not limited thereto.

Specific Example 1

Figure 13A:
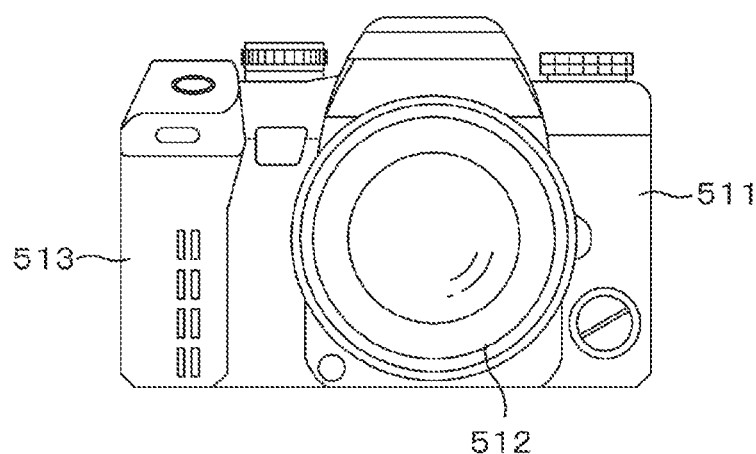
FIGS. 13A-B are external views of a digital still camera of a single-lens reflex type with interchangeable lenses. A front view thereof is illustrated in FIG. 13A, and a rear view thereof is illustrated in FIG. 13B.
Figure 13B:
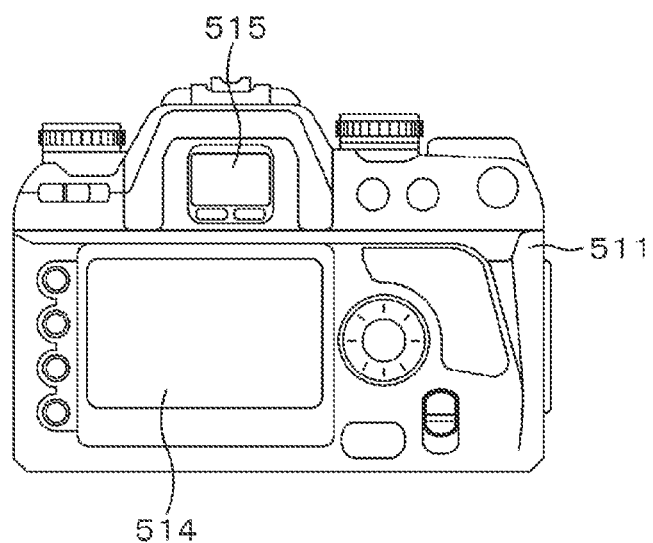

FIG. 13 is an external view of a digital still camera of a single-lens reflex type with interchangeable lenses. A front view thereof is illustrated in FIG. 13A, and a rear view thereof is illustrated in FIG. 13B. The digital still camera of a single-lens reflex type with interchangeable lenses includes, for example, an interchangeable photographing lens unit (interchangeable lens) 512 on the front right side of a camera main body (camera body) 511 and a grip portion 513 to be held by a photographer on the front left side.

A monitor 514 is provided substantially at the center of the back surface of the camera main body 511. A viewfinder (eyepiece window) 515 is provided above the monitor 514. By looking into the viewfinder 515, a photographer can visually recognize an optical image of a subject guided from the photographing lens unit 512 and determine the composition.

In the digital still camera of a single-lens reflex type with interchangeable lenses having the above structure, the display device of the present disclosure can be used as the viewfinder 515. That is, the digital still camera of a single-lens reflex type with interchangeable lenses according to the present example is manufactured by using the display device of the present disclosure as the viewfinder 515 thereof.

Specific Example 2

Figure 14:
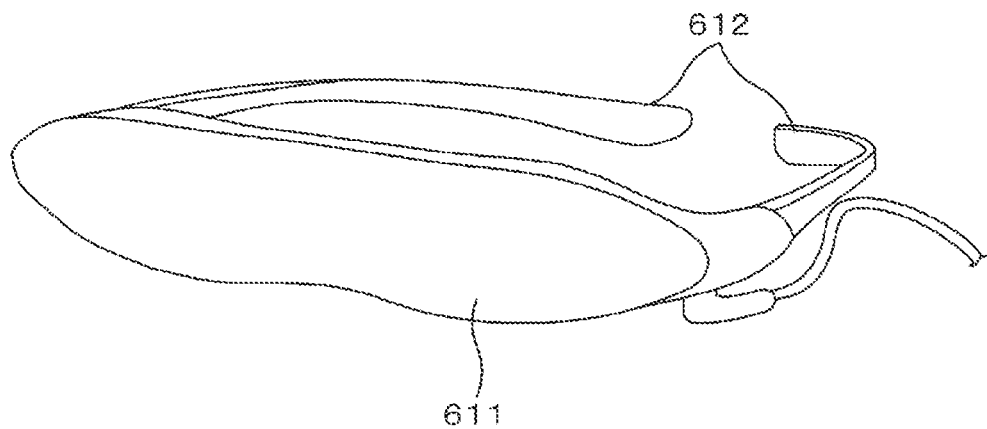
FIG. 14 is an external view of a head mounted display.

FIG. 14 is an external view of a head mounted display. The head mounted display includes, for example on both sides of a spectacle-shaped display unit 611, temples 612 to be fitted on the head of a user. In the head mounted display, the display device of the present disclosure can be used as the display unit 611 thereof. That is, the head mounted display according to the present example is manufactured by using the display device of the present disclosure as the display unit 611 thereof.

Specific Example 3

Figure 15:
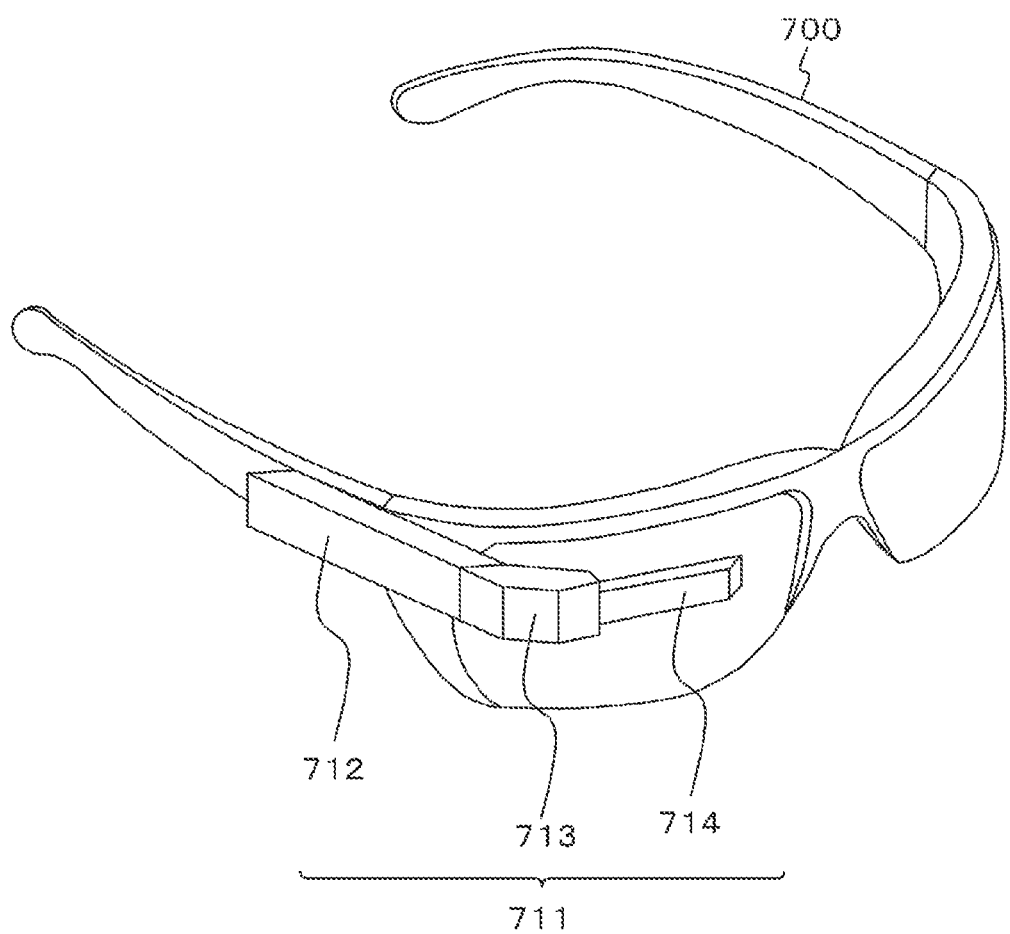
FIG. 15 is an external view of a see-through head mounted display.

FIG. 15 is an external view of a see-through head mounted display. A see-through head mounted display 711 includes a main body 712, an arm 713, and a lens barrel 714.

The main body 712 is connected with the arm 713 and spectacles 700. Specifically, an end of the main body 712 in the longitudinal direction is coupled to the arm 713, and one side of the side surfaces of the main body 712 is coupled to the spectacles 700 via a coupling member. Note that the main body 712 may be directly mounted on the head of a human body.

The main body 712 incorporates a control board for controlling the operation of the see-through head mounted display 711 and a display unit. The arm 713 connects the main body 712 and the lens barrel 714 and supports the lens barrel 714. Specifically, the arm 713 is coupled to the end of the main body 712 and an end of the lens barrel 714 and fixes the lens barrel 714. Furthermore, the arm 713 incorporates a signal line for communicating data related to an image provided from the main body 712 to the lens barrel 714.

The lens barrel 714 projects image light provided from the main body 712 via the arm 713 toward an eye of a user wearing the see-through head mounted display 711 through an eyepiece. In the see-through head mounted display 711, the display device of the present disclosure can be used for the display unit of the main body 712.

Note that the technology of the present disclosure can also have the following configurations.

[A1]

A display device comprising at least:
display elements arranged in a two-dimensional matrix in a first direction and a second direction different from the first direction;
data lines provided for respective display element columns arranged along the second direction; and
a source driver that supplies a video signal voltage to the data lines,
wherein a display element row arranged along the first direction includes a display element belonging to a first group and a display element belonging to a second group different from the first group,
the source driver comprises a ramp signal generating circuit and a switch circuit that causes a data line to hold a voltage as of a time point when the data line and output of the ramp signal generating circuit are switched from a connected state to a disconnected state,
the ramp signal generating circuit generates, within one horizontal scanning period, at least a ramp signal used for setting a video signal voltage to a display element belonging to the first group and a ramp signal used for setting a video signal voltage to a display element belonging to the second group, and
when output of the ramp signal generating circuit and a data line are switched from the connected state to the disconnected state in order to cause the data line corresponding to a certain display element to hold a video signal voltage, output of the ramp signal generating circuit and a data line corresponding to a display element belonging to a group different from the group, to which the certain display element belongs, are switched from the disconnected state to the connected state.

[A2]

The display device according to the above [A1],
wherein the display element belonging to the first group and the display element belonging to the second group are alternately arranged in the display element row.

[A3]

The display device according to the above [A2],
wherein, in the display element row, when output of the ramp signal generating circuit and a data line are switched from the connected state to the disconnected state in order to cause the data line corresponding to one display element of a pair of adjacent display elements to hold a video signal voltage, a data line corresponding to the other display element of the pair of the adjacent display elements and output of the ramp signal generating circuit are switched from the disconnected state to the connected state.

[A4]

The display device according to any one of the above [A1] to [A3], further comprising:
- a first scanning line connected to a display element belonging to the first group and a second scanning line connected to a display element belonging to the second group, the first scanning line and the second scanning line being provided for every display element row arranged along the first direction; and
- a vertical scanner that supplies a scanning signal to the first scanning line and the second scanning line.

[A5]

The display device according to any one of the above [A1] to [A4],
- wherein the display elements include organic electroluminescence display elements or liquid crystal display elements.

[A6]

The display device according to any one of the above [A1] to [A6], further comprising a second source driver,
- wherein the source driver and the second source driver are arranged on a first end side and a second end side of each of the data lines, respectively, and
- the second source driver supplies a signal corresponding to a ramp signal of the source driver to the data lines before a data line corresponding to a display element belonging to a group different from a group to which a certain display element belongs and output of the ramp signal generating circuit are switched from the disconnected state to the connected state.

[B1]

A drive method for a display device, the method comprising the steps of:
- by using the display device comprising at least:
  - display elements arranged in a two-dimensional matrix in a first direction and a second direction different from the first direction;
  - data lines provided for respective display element columns arranged along the second direction; and
  - a source driver that supplies a video signal voltage to the data lines,
- wherein a display element row arranged along the first direction includes a display element belonging to a first group and a display element belonging to a second group different from the first group, and
- the source driver comprises a ramp signal generating circuit and a switch circuit that causes a data line to hold a voltage as of a time point when the data line and output of the ramp signal generating circuit are switched from a connected state to a disconnected state,
- by the ramp signal generating circuit, generating, within one horizontal scanning period, at least a ramp signal used for setting a video signal voltage to a display element belonging to the first group and a ramp signal used for setting a video signal voltage to a display element belonging to the second group, and
- when switching output of the ramp signal generating circuit and a data line from the connected state to the disconnected state in order to cause the data line corresponding to a certain display element to hold a video signal voltage, switching output of the ramp signal generating circuit and a data line corresponding to a display element belonging to a group different from the group, to which the certain display element belongs, from the disconnected state to the connected state.

[B2]

The drive method for the display device according to the above [B1],
- in which the display element belonging to the first group and the display element belonging to the second group are alternately arranged in the display element row.

[B3]

The drive method for the display device according to the above [B2], in which, in the display element row, when output of the ramp signal generating circuit and a data line are switched from the connected state to the disconnected state in order to cause the data line corresponding to one display element of a pair of adjacent display elements to hold a video signal voltage, a data line corresponding to the other display element of the pair of the adjacent display elements and output of the ramp signal generating circuit are switched from the disconnected state to the connected state.

[B4]

The drive method for the display device according to the above [B4] or [B3],
- in which the display device further includes a second source driver, and
- the source driver and the second source driver are arranged on a first end side and a second end side of each of the data lines, respectively,
- the drive method further including the step of:
- by the second source driver, supplying a signal corresponding to a ramp signal of the source driver to the data lines before a data line corresponding to a display element belonging to a group different from a group to which a certain display element belongs and output of the ramp signal generating circuit are switched from the disconnected state to the connected state.

[C1]

An electronic apparatus comprising a display device, the display device comprising at least:
- display elements arranged in a two-dimensional matrix in a first direction and a second direction different from the first direction;
- data lines provided for respective display element columns arranged along the second direction; and
- a source driver that supplies a video signal voltage to the data lines,
- wherein a display element row arranged along the first direction includes a display element belonging to a first group and a display element belonging to a second group different from the first group,
- the source driver comprises a ramp signal generating circuit and a switch circuit that causes a data line to hold a voltage as of a time point when the data line and output of the ramp signal generating circuit are switched from a connected state to a disconnected state,
- the ramp signal generating circuit generates, within one horizontal scanning period, at least a ramp signal used for setting a video signal voltage to a display element belonging to the first group and a ramp signal used for setting a video signal voltage to a display element belonging to the second group, and
- when output of the ramp signal generating circuit and a data line are switched from the connected state to the disconnected state in order to cause the data line corresponding to a certain display element to hold a video signal voltage, output of the ramp signal generating circuit and a data line corresponding to a display element belonging to a group different from the group, to which the certain display element belongs, are switched from the disconnected state to the connected state.

[C2]
The electronic apparatus according to the above [C1], in which the display element belonging to the first group and the display element belonging to the second group are alternately arranged in the display element row.

[C3]
The electronic apparatus according to the above [C2], in which, in the display element row, when output of the ramp signal generating circuit and a data line are switched from the connected state to the disconnected state in order to cause the data line corresponding to one display element of a pair of adjacent display elements to hold a video signal voltage, a data line corresponding to the other display element of the pair of the adjacent display elements and output of the ramp signal generating circuit are switched from the disconnected state to the connected state.

[C4]
The electronic apparatus according to any one of the above [C1] to [C3],
in which the display device further includes:
a first scanning line connected to a display element belonging to the first group and a second scanning line connected to a display element belonging to the second group, the first scanning line and the second scanning line being provided for every display element row arranged along the first direction; and
a vertical scanner that supplies a scanning signal to the first scanning line and the second scanning line.

[C5]
The electronic apparatus according to any one of the above [C1] to [C4],
in which the display elements include organic electroluminescence display elements or liquid crystal display elements.

[C6]
The electronic apparatus according to any one of the above [C1] to [C6],
in which the display device further includes a second source driver,
the source driver and the second source driver are arranged on a first end side and a second end side of each of the data lines, respectively, and
the second source driver supplies a signal corresponding to a ramp signal of the source driver to the data lines before a data line corresponding to a display element belonging to a group different from a group to which a certain display element belongs and output of the ramp signal generating circuit are switched from the disconnected state to the connected state.

REFERENCE SIGNS LIST 1, 1A, 9 DISPLAY DEVICE
10, 10$_A$, 10$_B$ DISPLAY ELEMENT
100, 900 DISPLAY AREA
110 SOURCE DRIVER
110A SECOND SOURCE DRIVER
111, 111A RAMP SIGNAL GENERATING CIRCUIT
112, 112A SWITCH CIRCUIT
120 VERTICAL SCANNER
WS, WSA, WSB SCANNING LINE
DTL DATA LINE
SW, SWA SWITCH

511 CAMERA MAIN BODY
512 PHOTOGRAPHING LENS UNIT
513 GRIP PORTION
514 MONITOR
515 VIEWFINDER
611 SPECTACLE-SHAPED DISPLAY UNIT
612 TEMPLE
700 SPECTACLES
711 SEE-THROUGH HEAD MOUNTED DISPLAY
712 MAIN BODY
713 ARM
714 LENS BARREL

The invention claimed is:

1. A display device comprising:
a plurality of pixel circuits arranged in a two-dimensional matrix in a first direction and a second direction different from the first direction;
a plurality of data lines arranged along the second direction; and
a source driver configured to supply a ramp signal to the plurality of data lines,
wherein a pixel circuit row arranged along the first direction includes a pixel circuit belonging to a first group and a pixel circuit belonging to a second group different from the first group, and
the source driver is configured to
supply a first portion of the ramp signal to a first one of the plurality of data lines corresponding to the pixel circuit belonging to the first group during a first period of a horizontal scanning period, and
supply a second portion of the ramp signal to a second one of the plurality of data lines corresponding to the pixel circuit belonging to the second group during a second period of the horizontal scanning period, the second period being different from the first period,
wherein the ramp signal is a single ramp signal, wherein the first portion is a first non-discrete portion, wherein the second portion is a second non-discrete portion, and wherein the horizontal scanning period is a single horizontal scanning period.

2. The display device according to claim 1,
wherein the pixel circuit belonging to the first group and the pixel circuit belonging to the second group are alternately arranged in the pixel circuit row.

3. The display device according to claim 2, wherein the source driver includes a ramp signal generating circuit, and
wherein, in the pixel circuit row, when output of the ramp signal generating circuit and a first data line of the plurality of data lines are switched from a connected state to a disconnected state in order to cause the first data line corresponding to a first adjacent pixel circuit of a pair of adjacent pixel circuits to hold a video signal voltage, a second data line corresponding to a second adjacent pixel circuit of the pair of the adjacent pixel circuits and output of the ramp signal generating circuit are switched from the disconnected state to the connected state.

4. The display device according to claim 1, further comprising:
a first scanning line connected to a display element belonging to the first group and a second scanning line connected to a display element belonging to the second group, the first scanning line and the second scanning line being provided for every display element row arranged along the first direction; and
a vertical scanner that supplies a scanning signal to the first scanning line and the second scanning line.

5. The display device according to claim 1,
wherein the plurality of pixel circuits include organic electroluminescence display elements or liquid crystal display elements.

6. The display device according to claim 1, further comprising:
a second source driver,
wherein the source driver includes a ramp signal generating circuit configured to generate the ramp signal,
wherein the source driver and the second source driver are arranged on a first end side and a second end side of each of the plurality of data lines, respectively, and
the second source driver is configured to supply a signal corresponding to the ramp signal of the ramp signal generating circuit to the plurality of data lines before a data line corresponding to a pixel circuit belonging to a group different from a group to which a certain pixel circuit belongs and output of the ramp signal generating circuit are switched from a disconnected state to a connected state.

7. The display device according to claim 1, further comprising:
a plurality of switch circuits,
wherein the source driver includes a ramp signal generating circuit, and
wherein each switch circuit of the plurality of switch circuits is electrically connected to the ramp signal generating circuit, and the each switch circuit is configured to cause a corresponding one of the plurality of data lines to hold a voltage as of a time point when the corresponding one of the plurality of data lines and an output of the ramp signal generating circuit are switched from a connected state to a disconnected state, and each data line of the plurality of data lines is electrically connected to only one of the plurality of switch circuits.

8. A method comprising:
generating, with a ramp signal generating circuit of a source driver, a first portion of a ramp signal within a first period of a horizontal scanning period;
supplying, with a first switch circuit of the source driver, a first video signal to a first data line of a plurality of data lines by holding a voltage as of a time point when the first data line and an output of the ramp signal generating circuit are switched from a connected state to a disconnected state, the first video signal based on the first portion of the ramp signal, and the first data line electrically connected to a first plurality of display elements;
generating, with the ramp signal generating circuit of the source driver, a second portion of the ramp signal within a second period of the horizontal scanning period, the second period being different from the first period; and
supplying, with a second switch circuit of the source driver, a second video signal to a second data line of the plurality of data lines by holding a second voltage as of a second time point when the second data line and the output of the ramp signal generating circuit are switched from a connected state to a disconnected state, the second video signal based on the second portion of the ramp signal, and the second data line electrically connected to a second plurality of display elements.

9. The method according to claim 8,
wherein the first plurality of display elements and the second plurality of display elements are alternately arranged in a display element row.

10. The method according to claim 8, further comprising:
supplying, with a vertical scanner, a scanning signal to a first scanning line and a second scanning line,
wherein the first scanning line is connected to one of the first plurality of display elements,
wherein the second scanning line is connected to one of the second plurality of display elements, and
wherein the first scanning line and the second scanning line is provided for every display element row arranged along a first direction.

11. The method according to claim 8,
wherein the first plurality of display elements and the second plurality of display elements include organic electroluminescence display elements or liquid crystal display elements.

12. The method according to claim 8, wherein the source driver includes a first source sub-driver and a second source sub-driver, wherein the first source sub-driver and the second source sub-driver are arranged on a first end side and a second end side of each of the plurality of data lines, respectively, and
the method further comprising:
generating, with a second ramp signal generating circuit of the second source sub-driver, a first portion of a second ramp signal corresponding to the first portion of the ramp signal within a third horizontal scanning period;
supplying, with a first switch circuit of the second source sub-driver, the first portion of the second ramp signal to the first data line of the plurality of data lines when the first data line and output of the ramp signal generating circuit are in the disconnected state;
generating, with the second ramp signal generating circuit of the second source sub-driver, a second portion of the second ramp signal corresponding to the second ramp signal within a fourth horizontal scanning period; and
supplying, with a second switch circuit of the second source sub-driver, the second portion of the second ramp signal to the second data line of the plurality of data lines when the second data line and the output of the ramp signal generating circuit are in the disconnected state.

13. An electronic apparatus comprising:
a display device including
display elements arranged in a two-dimensional matrix in a first direction and a second direction different from the first direction;
data lines provided for respective display element columns arranged along the second direction; and
a source driver that supplies a video signal voltage to the data lines,
wherein a display element row arranged along the first direction includes a display element belonging to a first group and a display element belonging to a second group different from the first group,
the source driver comprises a ramp signal generating circuit and a switch circuit that causes a data line to hold a voltage as of a time point when the data line and output of the ramp signal generating circuit are switched from a connected state to a disconnected state,
the ramp signal generating circuit generates, within a first period of a horizontal scanning period, a first portion of a ramp signal used for setting a video signal voltage to a display element belonging to the first group, and
the ramp signal generating circuit generates, within a second period of the horizontal scanning period, a second portion of the ramp signal used for setting a video signal voltage to a display element belonging to the second group, and when output of the ramp signal generating circuit and a data line are switched from the connected state to the disconnected state in order to cause the data line corresponding to a certain display element to hold a video signal voltage, output of the ramp signal generating circuit and a data line corresponding to a display element belonging to a group different from the group, to which the certain display element belongs, are switched from the disconnected state to the connected state, wherein the ramp signal is a single ramp signal, wherein the first portion is a first non-discrete portion, wherein the second portion is a second non-discrete portion, and wherein the horizontal scanning period is a single horizontal scanning period.

14. The electronic apparatus according to claim 13, wherein the display element belonging to the first group and the display element belonging to the second group are alternately arranged in the display element row.

15. The electronic apparatus according to claim 14, wherein, in the display element row, when output of the ramp signal generating circuit and a data line are switched from the connected state to the disconnected state in order to cause the data line corresponding to a first adjacent display element of a pair of adjacent display elements to hold a video signal voltage, a data line corresponding to a second adjacent display element of the pair of the adjacent display elements and output of the ramp signal generating circuit are switched from the disconnected state to the connected state.

16. The electronic apparatus according to claim 13, further comprising:
a first scanning line connected to a display element belonging to the first group and a second scanning line connected to a display element belonging to the second group, the first scanning line and the second scanning line being provided for every display element row arranged along the first direction; and
a vertical scanner that supplies a scanning signal to the first scanning line and the second scanning line.

17. The electronic apparatus according to claim 13, wherein the display elements include organic electroluminescence display elements or liquid crystal display elements.

18. The electronic apparatus according to claim 13, further comprising a second source driver,
wherein the source driver and the second source driver are arranged on a first end side and a second end side of each of the data lines, respectively, and
the second source driver supplies a signal corresponding to the ramp signal of the source driver to the data lines before a data line corresponding to a display element belonging to a group different from a group to which a certain display element belongs and output of the ramp signal generating circuit are switched from the disconnected state to the connected state.

* * * * *